(12) United States Patent
Rhodes et al.

(10) Patent No.: US 11,566,100 B2
(45) Date of Patent: Jan. 31, 2023

(54) POLYCYCLOOLEFIN POLYMER AND INORGANIC NANOPARTICLE COMPOSITIONS AS OPTICAL MATERIALS

(71) Applicant: PROMERUS, LLC, Brecksville, OH (US)

(72) Inventors: Larry F Rhodes, Brecksville, OH (US); Oleksandr Burtovyy, Brecksville, OH (US); Wei Zhang, Brecksville, OH (US)

(73) Assignee: PROMERUS, LLC, Akron, OH (US)

( * ) Notice: Subject to any disclaimer, the term of this patent is extended or adjusted under 35 U.S.C. 154(b) by 375 days.

(21) Appl. No.: 16/983,495

(22) Filed: Aug. 3, 2020

(65) Prior Publication Data

US 2020/0362096 A1 Nov. 19, 2020

Related U.S. Application Data

(62) Division of application No. 16/100,345, filed on Aug. 10, 2018, now Pat. No. 10,767,002.

(60) Provisional application No. 62/543,449, filed on Aug. 10, 2017.

(51) Int. Cl.

| | | |
|---|---|---|
| *C08G 61/08* | (2006.01) | |
| *B01J 31/22* | (2006.01) | |
| *C08L 65/00* | (2006.01) | |
| *C08K 5/00* | (2006.01) | |
| *C08K 3/22* | (2006.01) | |
| *G03F 7/004* | (2006.01) | |
| *H01L 51/52* | (2006.01) | |

(52) U.S. Cl.
CPC .......... *C08G 61/08* (2013.01); *B01J 31/2273* (2013.01); *B01J 31/2278* (2013.01); *C08K 3/22* (2013.01); *C08K 5/0091* (2013.01); *C08L 65/00* (2013.01); *G03F 7/0045* (2013.01); *B01J 2231/14* (2013.01); *B01J 2531/821* (2013.01); *B01J 2531/825* (2013.01); *B01J 2540/525* (2013.01); *C08G 2261/3324* (2013.01); *C08G 2261/374* (2013.01); *C08G 2261/418* (2013.01); *C08G 2261/90* (2013.01); *C08K 2003/2237* (2013.01); *C08K 2003/2244* (2013.01); *C08K 2201/005* (2013.01); *H01L 51/5253* (2013.01); *H01L 2251/5369* (2013.01)

(58) Field of Classification Search
None
See application file for complete search history.

(56) References Cited

U.S. PATENT DOCUMENTS

2006/0258078 A1* 11/2006 Lee .................. H01L 21/02205
257/E21.192
2017/0058145 A1* 3/2017 Rhodes ................ C09D 167/02

FOREIGN PATENT DOCUMENTS

| EP | 1 614 410 A1 | 1/2006 | |
|---|---|---|---|
| EP | 2 045 280 A1 | 4/2009 | |
| JP | 2001-059018 A | 3/2001 | |
| JP | 2001059018 A * | 3/2001 | |
| WO | WO 99/22865 A1 | 5/1999 | |
| WO | WO 2016/063282 A1 | 4/2016 | |
| WO | WO-2016063282 A1 * | 4/2016 | .............. B01J 37/34 |

OTHER PUBLICATIONS

Computer-generated English-language translation of JP-2001059018-A.*
Andrey Y. Khalimon, et al., "Photogeneration of a Phosphonium Alkylidene Olefin Metathesis Catalyst," Organometallics, vol. 31, No. 15, pp. 5634-5637 (2012).
Benjamin K. Keitz, et al., "A tandem Approach to Photoactivated Olefin Metathesis: Combining a Photoacid Generator with an Acid Activated Catalyst," J. Am. Chem. Soc., vol. 131, No. 6, pp. 2038-2039 (2009).
Georg Gaertner, et al., "Light extraction from OLEDS with (high) index matched glass substrates," Proceedings of SPIE, vol. 6999, p. 69992T-1 to 69992T-12, Apr. 25, 2008.
Kanji Suyama, et al., "Photobase generators: Recent Progress and application trend in polymer systems," Progress in Polymer Science, vol. 34, No. 2, pp. 194-209 (2009).
Gawin, et al., "Bis(Cyclic Alkyl Amino Carbene) Ruthenium Complexes: A Versatile, Highly Efficient Tool for Olefin Metatheis," Angew. Chem. Int. Ed. 2017, 56, 981-986.
SciFinder Search (Jun. 22, 2020).

* cited by examiner

*Primary Examiner* — Vu A Nguyen

(74) *Attorney, Agent, or Firm* — Balaram Gupta

(57) ABSTRACT

Embodiments in accordance with the present invention encompass compositions encompassing a latent catalyst and a thermal or photoactivator along with one or more monomers which undergo ring open metathesis polymerization (ROMP) when said composition is heated to a temperature from 50° C. to 100° C. or higher to form a substantially transparent film. Alternatively the compositions of this invention also undergo polymerization when subjected to suitable radiation. The monomers employed therein have a range of refractive index from 1.4 to 1.6 and thus these compositions can be tailored to form transparent films of varied refractive indices. The compositions of this invention further comprises inorganic nanoparticles which form transparent films and further increases the refractive indices of the compositions. Accordingly, compositions of this invention are useful in various opto-electronic applications, including as coatings, encapsulants, fillers, leveling agents, among others.

20 Claims, No Drawings

POLYCYCLOOLEFIN POLYMER AND INORGANIC NANOPARTICLE COMPOSITIONS AS OPTICAL MATERIALS

CROSS REFERENCE TO RELATED APPLICATIONS

This application is a divisional of U.S. application Ser. No. 16/100,345, filed Aug. 10, 2018, now allowed, which claims the benefit of U.S. Provisional Application No. 62/543,449 filed Aug. 10, 2017, which is incorporated herein by reference in its entirety.

BACKGROUND OF THE INVENTION

Field of the Invention

Embodiments in accordance with the present invention relate generally to a single component mass polymerizable polycycloolefin monomer and inorganic nanoparticle dispersed compositions having high optical transparency and exhibiting suitable refractive index that match the refractive index of layers in optical devices, such as optical sensors, light emitting diodes (LEDs), organic light emitting diode (OLED), among other devices. More specifically, this invention relates to single component room temperature stable compositions encompassing norbornene (NB) based olefinic monomers in which inorganic nanoparticles are dispersed, which undergo mass polymerization when subjected to higher temperatures or photolytic conditions to form transparent optical layers having utility in a variety of optoelectronic applications including as encapsulants, coatings, and fillers.

Description of the Art

Organic light emitting diodes (OLEDs) are gaining importance in a variety of applications, including flat panel televisions and other flexible displays, among other applications. However, conventional OLEDs, particularly, bottom emitting OLEDs suffer from a drawback in that only about half of the generated photons are emitted into the glass substrate out of which 25% are extracted into air. The other half of the photons are wave-guided and dissipated in the OLED stack. This loss of photons is primarily attributed to the refractive index (n) mismatch between the organic layers (n=1.7-1.9) and the glass substrate (n=1.5). By matching the refractive index of the substrate (n=1.8) and organic layers and augmenting the distance of the emission zone to the cathode to suppress plasmonic losses light extraction into the substrate can be increased to 80-90%. See, for example, G. Gaertner et al., Proc. Of SPIE, Vol. 6999, 69992T pp 1-12 (2008).

In addition, OLEDs also pose other challenges; in that OLEDs being organic materials, they are generally sensitive to moisture, oxygen, temperature, and other harsh conditions. Thus, it is imperative that OLEDs are protected from such harsh atmospheric conditions. See for example, U.S. Patent Application Publication No. US2012/0009393 A1.

In order to address some of the issues faced by the art, U.S. Pat. No. 8,263,235 discloses use of a light emitting layer formed from at least one organic light emitting material and an aliphatic compound not having an aromatic ring, and a refractive index of the light emitting from 1.4 to 1.6. The aliphatic compounds described therein are generally a variety of polyalkyl ethers, and the like, which are known to be unstable at high temperatures, see for example, Rodriguez et al., I & EC Product Research and Development, Vol. 1, No. 3, 206-210 (1962).

The co-pending U.S. patent application Ser. No. 15/253,980, filed Sep. 1, 2016, discloses a two component mass polymerizable composition which is capable of tailoring to the desirable refractive index and is suitable as a filler and a protective coating material, thus potentially useful in the fabrication of a variety of OLED devices. Although this approach may provide certain advantages it still suffers from the drawback of being two component system and in addition organic polymers alone may not be able to provide required high refractive index for the OLED applications. Furthermore, there is also a need for mass polymerizable compositions which are stable at room temperatures as well as OLED fabrication conditions and yet polymerize instantly when subjected to suitable higher temperatures and/or photolytic conditions.

Accordingly, there is still a need for filler materials that complement the refractive index of OLEDs and yet exhibit high transparency and good thermal properties, among other desirable properties. In addition, it is desirable that such organic filler materials readily form a permanent protective coatings and are available as a single component composition for dispensing with such OLED layers.

Thus, it is an object of this invention to provide organic/inorganic nanoparticle composite materials that overcome the gaps faced by the art. More specifically, it is an object of this invention to provide a single component composition that will mass polymerize under the conditions of the fabrications of an OLED device. It is further an object of this invention to provide stable single component mass polymerizable composition with no change in viscosity at or below normal storage conditions but which undergoes mass polymerization only under the process conditions in which the OLED device is finally fabricated, such as for example by the use of radiation and/or thermal process.

Other objects and further scope of the applicability of the present invention will become apparent from the detailed description that follows.

SUMMARY OF THE INVENTION

Surprisingly, it has now been found that by employing a single component filler composition, it is now possible to fabricate an OLED device having a transparent optical layer which features hitherto unachievable properties, i.e., refractive index in the range of 1.4 to 1.8 or higher, high colorless optical transparency, desirable film thickness of the filler layer typically in the range of 10 to 20 µm but can be tailored to lower or higher film thickness depending upon the intended application, compatible with the OLED stack, particularly the cathode layer (a very thin layer on the top of the OLED stack), compatible with polymerization of the formulation on the OLED stack, including fast polymerization time and can be photolytically or thermally treated at less than 100° C., adhesion to both OLED stack and glass cover, and the like. It is also important to note that the compositions of this invention are expected to exhibit good uniform leveling across the OLED layer which typically requires a low viscosity. Further, compositions of this invention are also expected to exhibit low shrinkage due to their rigid polycycloolefinic structure. In addition, as the components of this invention undergo fast mass polymerization upon application they do not leave behind any fugitive small molecules which can damage the OLED stack. Generally, no other small molecule additives need to be employed thus offering additional advantages. Most importantly, the compositions of this invention are stable (i.e., no change in viscosity) at ambient atmospheric conditions including up to 35° C. for several hours, and undergo mass polymerization only above 50° C. or higher temperature or under photolytic conditions. The compositions cure very quickly when subjected to higher than 50° C. and generally the compositions are cured in less than one hour.

Advantageously, the compositions of this invention are also compatible with a "one drop fill" (commonly known as "ODF"). In a typical ODF process, which is commonly used to fabricate a top emission OLED device, a special optical fluid is applied to enhance the transmission of light from the device to the top cover glass, and the fluid is dispensed by an ODF method. Although the method is known as ODF which can be misleading because several drops or lines of material are generally dispensed inside the seal lines. After applying the fluid, the fluid spreads out as the top glass is laminated, analogous to die-attach epoxy. This process is generally carried out under vacuum to prevent air entrapment. The present invention allows for a material of low viscosity which readily and uniformly coats the substrate with rapid flow in a short period of time. Even more advantageously, the present invention overcomes the deficiencies faced by the prior art in that a single component composition is much more convenient than employing a two component system especially in an ODF method.

Accordingly, there is provided a single component composition encompassing:

a) one or more monomers of formula (I):

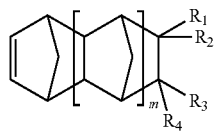

(I)

wherein:

m is an integer 0, 1 or 2;

$R_1$, $R_2$, $R_3$ and $R_4$ are the same or different and each independently selected from the group consisting of hydrogen, halogen, methyl, ethyl, linear or branched ($C_3$-$C_{16}$)alkyl, perfluoro($C_1$-$C_{12}$)alkyl, hydroxy($C_1$-$C_{16}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_6$)alkyl, perfluoro($C_6$-$C_{10}$)aryl, perfluoro($C_6$-$C_{10}$)aryl($C_1$-$C_3$)alkyl, tri($C_1$-$C_6$)alkoxysilyl and a group of formula (A):

—Z-Aryl            (A)

wherein:

Z is a bond or a group selected from the group consisting of:

($CR_5R_6$)$_a$, O($CR_5R_6$)$_a$, ($CR_5R_6$)$_a$O, ($CR_5R_6$)$_a$—O—($CR_5R_6$)$_b$, ($CR_5R_6$)$_a$—O—($SiR_5R_6$)$_b$, ($CR_5R_6$)$_a$—(CO)O—($CR_5R_6$)$_b$, ($CR_5R_6$)$_a$—O(CO)—($CR_5R_6$)$_b$, ($CR_5R_6$)$_a$—(CO)—($CR_5R_6$)$_b$, where a and b are integers which may be the same or different and each independently is 1 to 12;

$R_5$ and $R_6$ are the same or different and each independently selected from the group consisting of hydrogen, methyl, ethyl, linear or branched ($C_3$-$C_6$)alkyl, hydroxy, methoxy, ethoxy, linear or branched ($C_3$-$C_6$)alkyloxy, acetoxy, ($C_2$-$C_6$)acyl, hydroxymethyl, hydroxyethyl, linear or branched hydroxy($C_3$-$C_6$)alkyl, phenyl and phenoxy;

Aryl is phenyl or phenyl substituted with one or more of groups selected from the group consisting of methyl, ethyl, linear or branched ($C_3$-$C_6$)alkyl, hydroxy, methoxy, ethoxy, linear or branched ($C_3$-$C_6$)alkyloxy, acetoxy, ($C_2$-$C_6$)acyl, hydroxymethyl, hydroxyethyl, linear or branched hydroxy($C_3$-$C_6$)alkyl, phenyl and phenoxy;

b) a latent organo-transition metal catalyst comprising a metal selected from the group consisting of ruthenium and osmium; and c) one or more additives selected from the group consisting of a photoactive acid generator, a photoactive base generator, a thermal acid generator, a thermal base generator and a mixture in any combination thereof; and wherein said monomer of formula (I) is having a refractive index of at least 1.5 and said composition is in a clear liquid form at room temperature.

In another aspect of this invention there is further provided a composition comprising one or more monomers of formula (I) as described herein along with a latent organo-transition metal catalyst as described herein and a dispersion comprising nanoparticles.

In another aspect of this invention there is also provided a kit encompassing the composition of this invention for forming a transparent film.

DETAILED DESCRIPTION

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "  " denotes a position at which the bonding takes place with another repeat unit or another atom or molecule or group or moiety as appropriate with the structure of the group as shown.

As used herein, "hydrocarbyl" refers to a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "($C_1$-$C_6$)alkyl" includes methyl and ethyl groups, and straight-chained or branched propyl, butyl, pentyl and hexyl groups. Particular alkyl groups are methyl, ethyl, n-propyl, isopropyl and tert-butyl. Derived expressions such as "($C_1$-$C_4$)alkoxy", "($C_1$-$C_4$) thioalkyl", "($C_1$-$C_4$)alkoxy($C_1$-$C_4$)alkyl", "hydroxy($C_1$-$C_4$) alkyl", "($C_1$-$C_4$)alkylcarbonyl", "($C_1$-$C_4$)alkoxycarbonyl ($C_1$-$C_4$)alkyl", "($C_1$-$C_4$)alkoxycarbonyl", "diphenyl($C_1$-$C_4$) alkyl", "phenyl($C_1$-$C_4$)alkyl", "phenylcarboxy($C_1$-$C_4$)alkyl" and "phenoxy($C_1$-$C_4$)alkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "($C_1$-$C_6$)perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "($C_1$-$C_6$)perfluoroalkoxy", is to be construed accordingly. It should further be noted that certain of the alkyl groups as described herein, such as for example, "($C_1$-$C_6$)alkyl" may partially be fluorinated, that is, only portions of the hydrogen atoms in said alkyl group are replaced with fluorine atoms and shall be construed accordingly.

As used herein, the expression "($C_6$-$C_{10}$)aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art.

As used herein, the expression "($C_6$-$C_{10}$)aryl($C_1$-$C_4$)alkyl" means that the ($C_6$-$C_{10}$)aryl as defined herein is further attached to ($C_1$-$C_4$)alkyl as defined herein. Representative examples include benzyl, phenylethyl, 2-phenylpropyl, 1-naphthylmethyl, 2-naphthylmethyl and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of ($C_1$-$C_6$)alkyl, ($C_2$-$C_6$)alkenyl, ($C_1$-$C_6$)perfluoroalkyl, phenyl, hydroxy, —$CO_2H$, an ester, an amide, ($C_1$-$C_6$) alkoxy, ($C_1$-$C_6$)thioalkyl and ($C_1$-$C_6$)perfluoroalkoxy. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

By the term "latent organo-transition metal catalyst" is meant organo-transition metal compounds that show little or no catalytic activity at a particular (usually ambient atmospheric conditions) temperature and initiate such activity either upon heat or light or both.

By the term "derived" is meant that the polymeric repeating units are polymerized (formed) from, for example, polycyclic norbornene-type monomers in accordance with formulae (I) or (IV) wherein the resulting polymers are ring opened metathesis polymerized (ROMP), for example, the 2,3 double bond of norbornene-type monomers are ring opened and polymerized as shown below:

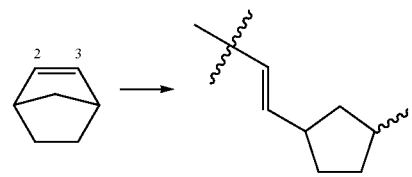

Accordingly, in accordance with the practice of this invention there is provided a single component composition encompassing a) one or more monomers of formula (I):

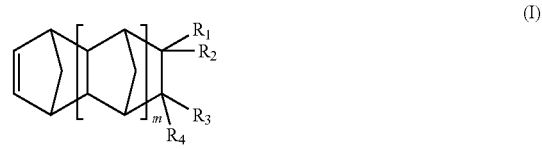

wherein:

m is an integer 0, 1 or 2;

$R_1$, $R_2$, $R_3$ and $R_4$ are the same or different and each independently selected from the group consisting of hydrogen, halogen, methyl, ethyl, linear or branched ($C_3$-$C_{16}$)alkyl, perfluoro($C_1$-$C_{12}$)alkyl, hydroxy($C_1$-$C_{16}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_6$)alkyl, perfluoro($C_6$-$C_{10}$)aryl, perfluoro($C_6$-$C_{10}$)aryl ($C_1$-$C_3$)alkyl, tri($C_1$-$C_6$)alkoxysilyl and a group of formula (A):

—Z-Aryl (A)

wherein:

Z is a bond or a group selected from the group consisting of:

($CR_5R_6$)$_a$, O($CR_5R_6$)$_a$, ($CR_5R_6$)$_a$O, ($CR_5R_6$)$_a$—O—($CR_5R_6$)$_b$, ($CR_5R_6$)$_a$—O—($SiR_5R_6$)$_b$, ($CR_5R_6$)$_a$—(CO)O—($CR_5R_6$)$_b$, ($CR_5R_6$)$_a$—O(CO)—($CR_5R_6$)$_b$, ($CR_5R_6$)$_a$—(CO)—($CR_5R_6$)$_b$, where a and b are integers which may be the same or different and each independently is 1 to 12;

$R_5$ and $R_6$ are the same or different and each independently selected from the group consisting of hydrogen, methyl, ethyl, linear or branched ($C_3$-$C_6$)alkyl, hydroxy, methoxy, ethoxy, linear or branched ($C_3$-$C_6$)alkyloxy, acetoxy, ($C_2$-$C_6$)acyl, hydroxymethyl, hydroxyethyl, linear or branched hydroxy($C_3$-$C_6$) alkyl, phenyl and phenoxy;

Aryl is phenyl or phenyl substituted with one or more of groups selected from the group consisting of methyl, ethyl, linear or branched ($C_3$-$C_6$)alkyl, hydroxy, methoxy, ethoxy, linear or branched ($C_3$-$C_6$)alkyloxy, acetoxy, ($C_2$-$C_6$)acyl, hydroxymethyl, hydroxyethyl, linear or branched hydroxy($C_3$-$C_6$)alkyl, phenyl and phenoxy;

b) a latent organo-transition metal catalyst comprising a metal selected from the group consisting of ruthenium and osmium; and c) one or more additives selected from the group consisting of a photoactive acid generator, a photoactive base generator, a thermal acid generator, a thermal base generator and a mixture in any combination thereof.

As used herein the Aryl may further include the following:

substituted or unsubstituted biphenyl of formula:

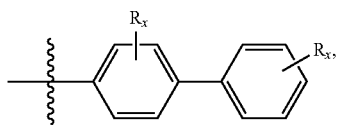

substituted or unsubstituted naphthyl of formula:

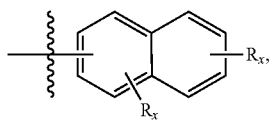

substituted or unsubstituted terphenyl of formula:

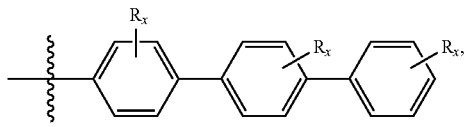

substituted or unsubstituted anthracenyl of formula:

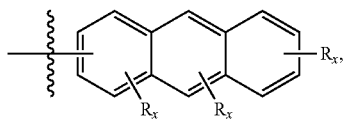

substituted or unsubstituted fluorenyl of formula:

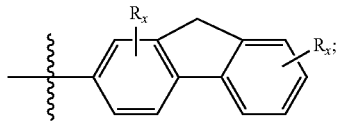

where $R_x$ in each occurrence is independently selected from methyl, ethyl, linear or branched $(C_3-C_{12})$alkyl or $(C_6-C_{10})$aryl.

As noted, the monomer of formula (I) is having a refractive index of at least 1.5. The composition is in a clear liquid form at room temperature.

The monomers employed in the composition of this invention are themselves known in the literature or can be prepared by any of the known methods in the art to make such or similar types of monomers.

In addition, the monomers as described herein readily undergo mass polymerization, i.e., in their neat form without use of any solvents when polymerized under mass ring open metathesis polymerization (ROMP) conditions using certain transition metal catalysts, such as for example, organo-ruthenium and organo-osmium compounds. See for example, R. H. Grubbs et al., *Handbook of Metathesis*, Ed.: Wiley-VCH, Weinheim, Germany, 2003, R. H. Grubbs et al., *Acc. Chem. Res.* 2001, 34, 18-29, R. H. Grubbs et al., *Angew. Chem. Int. Ed.,* 2006, 45, 3760-3765. Also, see U.S. Pat. No. 6,838,489, pertinent portions of which are incorporated herein by reference. The term "mass polymerization" as used herein shall have the generally accepted meaning in the art. That is, a polymerization reaction that is generally carried out substantially in the absence of a solvent. In some cases, however, a small proportion of solvent is present in the reaction medium. For example, such small amounts of solvent may be used to dissolve the latent catalyst and/or the activator or convey the same to the reaction medium. Also, some solvent may be used to reduce the viscosity of the monomer. The amount of solvent that can be used in the reaction medium may be in the range of 0 to 5 weight percent based on the total weight of the monomers employed. Any of the suitable solvents that dissolves the catalyst, activator and/or monomers can be employed in this invention. Examples of such solvents include alkanes, cycloalkane, toluene, THF, dichloromethane, dichloroethane, and the like.

Advantageously, it has now been found that one or more of the monomers themselves can be used to dissolve the latent catalyst as well as the activator and thus avoiding the need for the use of solvents. In addition, one monomer can itself serve as a solvent for the other monomer and thus eliminating the need for an additional solvent. For example, if first monomer of formula (I) is a solid at room temperature, then the second monomer of formula (I), which is liquid at room temperature can be used as a solvent for the first monomer of formula (I) which is a solid or vice versa. Therefore, in such situations more than one monomer can be employed in the composition of this invention.

Accordingly, it has now been surprisingly found that monomers of formula (I) serve as high refractive index materials imparting high refractive index to the resulting polymeric film upon mass polymerization at a temperature and/or condition different from the application of the composition onto a desirable substrate. In general, the monomers of formula (I) which are suitable in this invention feature a refractive index of at least 1.5. In some embodiments the refractive index of the monomers of formula (I) is higher than 1.5. In some other embodiments the refractive index of the monomers of formula (I) is in the range from about 1.5 to 1.6. In yet some other embodiments the refractive index of the monomers of formula (I) is higher than 1.55, higher than 1.6 or higher than 1.65. In some other embodiments it may even be higher than 1.7.

In general, the composition of this invention exhibits low viscosity, which can be below 100 centipoise or higher. In some embodiments, the viscosity of the composition of this invention is less than 90 centipoise. In some other embodiments the viscosity of the composition of this invention is in the range from about 10 to 100 centipoise. In yet some other embodiments the viscosity of the composition of this invention is lower than 80 cP, lower than 60 cP, lower than 40 cP, lower than 20 cP. In some other embodiments it may even be lower than 20 cP.

When the composition of this invention contains two or more monomers, for example, they can be present in any desirable amounts that would bring about intended benefit, including either refractive index modification or viscosity modification or both. Accordingly, the molar ratio of first monomer of formula (I) to second monomer of formula (II) can be from 1:99 to 99:1. In some embodiments, the molar ratio of first monomer of formula (I): second monomer of formula (I) is in the range from 5:95 to 95:5; in some other embodiments it is from 10:90 to 90:10; it is from 20:80 to 80:20; it is from 30:70 to 70:30; it is from 60:40 to 40:60; and it is 50:50, and so on. Similarly, when more than two different monomers of formula (I) are employed, any ratios of such monomers can be used that would bring about the intended result.

In general, the compositions in accordance with the present invention encompass the above described one or more of the monomer of formula (I) and if needed additional monomers of formula (I) distinct from each other, as it will be seen below, various composition embodiments are selected to provide properties to such embodiments that are appropriate and desirable for the use for which such embodiments are directed, thus such embodiments are tailorable to a variety of specific applications.

For example, as already discussed above, proper combination of distinctive monomers of formula (I) makes it possible to tailor a composition having the desirable refractive index, viscosity and optical transmission properties. In addition, as described further herein it may be desirable to include other polymeric or monomeric materials, such as for example inorganic nanoparticles which are compatible to provide desirable optical properties depending upon the end use application. Accordingly, the compositions of this invention can also include other high refractive polymeric materials and/or nanoparticles which will bring about such intended benefit. Examples of such polymers include without any limitation, poly(α-methylstyrene), poly(vinyl-toluene), copolymers of α-methylstyrene and vinyl-toluene, and the like. Examples of nanoparticles are described further in detail below.

Advantageously, it has further been found that the compositions of this invention can also contain additional monomers. In some embodiments, the composition according to this invention may further contain one or more monomers selected from monomer of formula (IV).

The monomer of formula (IV) is:

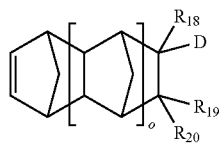

(IV)

wherein:
o is an integer from 0 to 2, inclusive;
D is SiR$_{21}$R$_{22}$R$_{23}$ or a group selected from:

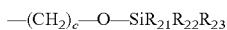  (E);

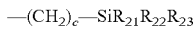  (F); and

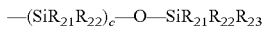  (G); wherein c is an integer from 1 to 10, inclusive, and where one or more of CH$_2$ is optionally substituted with (C$_1$-C$_{10}$)alkyl, (C$_1$-C$_{10}$)perfluoroalkyl or (C$_6$-C$_{14}$)aryl;

R$_{18}$, R$_{19}$ and R$_{20}$ are the same or different and independently of each other selected from hydrogen, halogen and hydrocarbyl, where hydrocarbyl is selected from methyl, ethyl, linear or branched (C$_3$-C$_{12}$)alkyl, (C$_3$-C$_{12}$)cycloalkyl, (C$_6$-C$_{12}$)bicycloalkyl, (C$_7$-C$_{14}$)tricycloalkyl, (C$_6$-C$_{10}$)aryl, (C$_6$-C$_{10}$)aryl(C$_1$-C$_3$)alkyl, (C$_1$-C$_{12}$)alkoxy, (C$_3$-C$_{12}$)cycloalkoxy, (C$_6$-C$_{12}$)bicycloalkoxy, (C$_7$-C$_{14}$)tricycloalkoxy, (C$_6$-C$_{10}$)aryloxy(C$_1$-C$_3$)alkyl or (C$_6$-C$_{10}$)aryloxy; and R$_{21}$, R$_{22}$ and R$_{23}$ are each independently of one another methyl, ethyl, linear or branched (C$_3$-C$_9$)alkyl, substituted or unsubstituted (C$_6$-C$_{14}$)aryl, methoxy, ethoxy, linear or branched (C$_3$-C$_9$)alkoxy or substituted or unsubstituted (C$_6$-C$_{14}$)aryloxy.

In this aspect of the invention, it has now been found that monomers of formula (IV) provides further advantages. Namely, the monomers of formula (IV) depending upon the nature of the monomer may impart high or low refractive index to the composition, thus it can be tailored to meet the need. In addition, the monomers of formula (IV) generally improve the adhesion properties and thus can be used as "adhesion modifiers." Finally, the monomers of formula (IV) may exhibit low viscosity and good solubility for the latent catalyst and/or activator, among various other advantages.

Accordingly, any of the monomers within the scope of monomer of formula (I) can be employed in the composition of the invention. Representative examples of monomer of formula (I) include the following without any limitations:

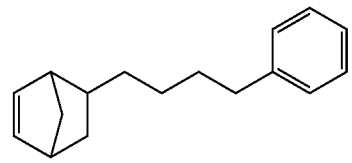 [SMILES: C1=CC2CC1CC2CCCCc1ccccc1]

5-(4-phenylbutyl)bicyclo[2.2.1]hept-2-ene;

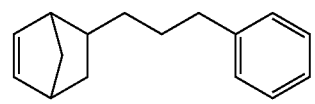 [SMILES: C1=CC2CC1CC2CCCc1ccccc1]

5-(3-phenylpropyl)bicyclo[2.2.1]hept-2-ene;

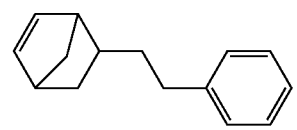 [SMILES: C1=CC2CC1CC2CCc1ccccc1]

5-phenethylbicyclo[2.2.1]hept-2-ene (PENB);

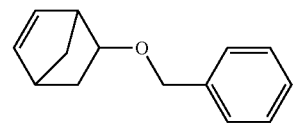 [SMILES: C1=CC2CC1CC2OCc1ccccc1]

5-(benzyloxy)bicyclo[2.2.1]hept-2-ene;

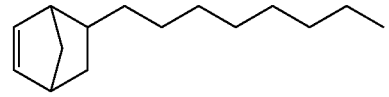

5-octylbicyclo[2.2.1]hept-2-ene (OctNB);

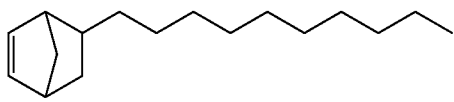 [SMILES: CCCCCCCCCCC1CC2C=CC1C2]

5-decylbicyclo[2.2.1]hept-2-ene (DecNB);

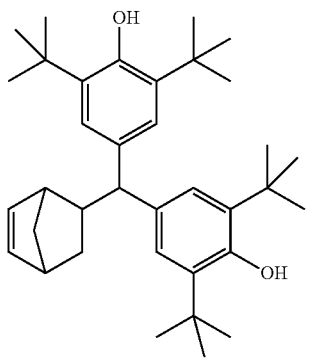 [SMILES: CC(C)(C)c1cc(C(c2cc(C(C)(C)C)c(O)c(C(C)(C)C)c2)C2CC3C=CC2C3)cc(C(C)(C)C)c1O]

4,4'-(bicyclo[2.2.1]hept-5-en-2-ylmethylene)bis(2,6-di-tert-butylphenol) (AOAONB);

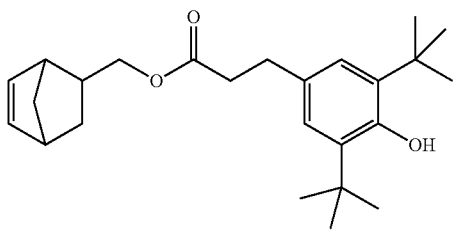 [SMILES: CC(C)(C)c1cc(CCC(=O)OCC2CC3C=CC2C3)cc(C(C)(C)C)c1O]

bicyclo[2.2.1]hept-5-en-2-ylmethyl 3-(3,5-di-tert-butyl-4-hydroxyphenyl)propanoate (AONB);

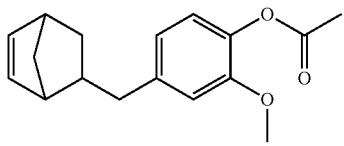 [SMILES: COc1cc(CC2CC3C=CC2C3)ccc1OC(C)=O]

5-norbornenylmethyleugenyl acetate (EuAcNB);

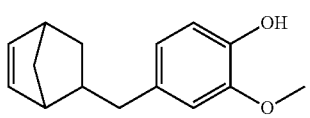 [SMILES: COc1cc(CC2CC3C=CC2C3)ccc1O]

5-norbornenylmethyleugenol (EuOHNB);

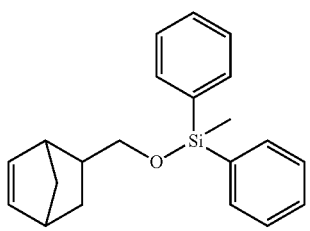 [SMILES: C[Si](OCC1CC2C=CC1C2)(c1ccccc1)c1ccccc1]

(bicyclo[2.2.1]hept-5-en-2-ylmethoxy)(methyl)diphenylsilane (NBCH$_2$OSiMePh$_2$);

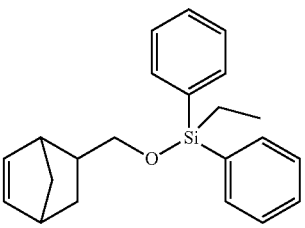 [SMILES: CC[Si](OCC1CC2C=CC1C2)(c1ccccc1)c1ccccc1]

(bicyclo[2.2.1]hept-5-en-2-ylmethoxy)(ethyl)diphenylsilane;

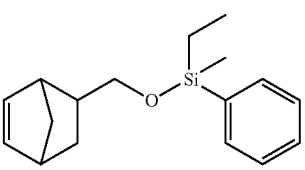 [SMILES: CC[Si](C)(OCC1CC2C=CC1C2)c1ccccc1]

(bicyclo[2.2.1]hept-5-en-2-ylmethoxy)(ethyl)(methyl)(phenyl)silane;

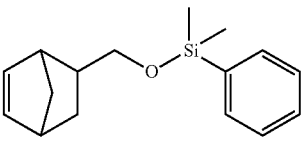 [SMILES: C[Si](C)(OCC1CC2C=CC1C2)c1ccccc1]

(bicyclo[2.2.1]hept-5-en-2-ylmethoxy)dimethyl(phenyl)silane;

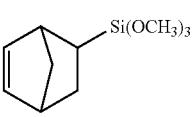

bicyclo[2.2.1]hept-5-en-2-yltrimethoxysilane (TMSNB);

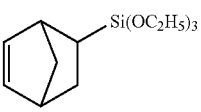

bicyclo[2.2.1]hept-5-en-2-yltriethoxysilane (NBSi(OC$_2$H$_5$)$_3$);

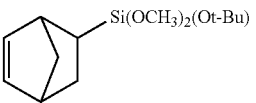

bicyclo[2.2.1]hept-5-en-2-yl(tert-butoxy)dimethoxysilane;

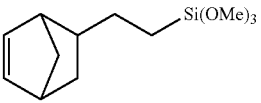

(2-(bicyclo[2.2.1]hept-5-en-2-yl)ethyl)trimethoxysilane;

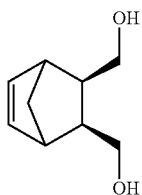 [SMILES: OC[C@@H]1C2C=CC(C2)[C@@H]1CO]

5,6-di(hydroxymethyl)bicyclo[2.2.1]hept-2-ene (NB(MeOH)$_2$); and

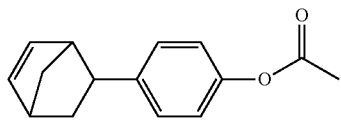 [SMILES: CC(=O)Oc1ccc(C2CC3C=CC2C3)cc1]

bicyclo[2.2.1]hept-5-en-2-yl-phenyl acetate (PhAcNB);

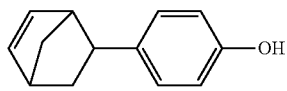 [SMILES: Oc1ccc(C2CC3C=CC2C3)cc1]

bicyclo[2.2.1]hept-5-en-2-yl-phenol (NBPhOH); and

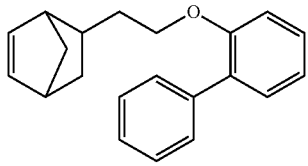 [SMILES: C1=CC2CC1CC2CCOc1ccccc1-c1ccccc1]

5-(2-([1,1'-biphenyl]-2-yloxy)ethyl)bicyclo[2.2.1]hept-2-ene (NBEtOPhPh).

In a further embodiment of this invention, the composition contains any of the latent catalyst that would bring about the mass polymerization as described herein under ROMP conditions. Generally, such suitable latent catalysts include a number of known organo-transition metal complexes, such as organo-ruthenium or organo-osmium compounds, among others.

Accordingly, the composition of this invention encompasses a latent catalyst which is an organo-ruthenium compound selected from the group consisting of a compound of formula (II) and a compound of formula (III):

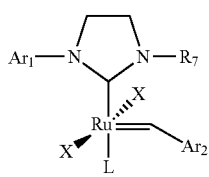

(IIA)

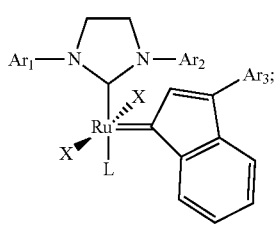

(IIB)

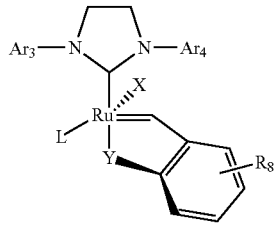

(IIIA)

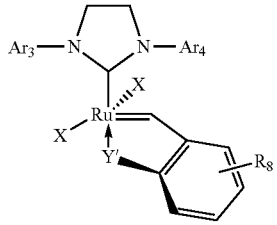

(IIIB)

(IIIC)

and wherein:
X is a halogen selected from the group consisting of chlorine, bromine and iodine;
Y is selected from the group consisting of O and S;
Y' is OR$_9$SR$_9$ and —N═CHC(O)O(C$_1$-C$_6$)alkyl, where R$_9$ is selected from the group consisting of methyl, ethyl, linear or branched (C$_1$-C$_6$)alkyl, (C$_6$-C$_{10}$)aryl, methoxy, ethoxy, linear or branched (C$_1$-C$_6$)alkoxy, (C$_6$-C$_{10}$)aryloxy, —OCH(CH$_3$)C(O)N(CH$_3$)(OCH$_3$);
L is PR$_3$ or O═PR$_3$, where R is independently selected from the group consisting of isopropyl, sec-butyl, tert-butyl, cyclohexyl, bicyclo(C$_5$-C$_{10}$)alkyl, phenyl, benzyl, isopropoxy, sec-butoxy, tert-butoxy, cyclohexyloxy, phenoxy and benzyloxy;
R$_7$ is selected from the group consisting of isopropyl, sec-butyl, tert-butyl, substituted or unsubstituted cyclohexyl, substituted or unsubstituted phenyl, substituted or unsubstituted biphenyl and substituted or unsubstituted naphthyl;
R$_8$ is selected from the group consisting of methyl, ethyl, linear or branched (C$_1$-C$_6$)alkyl, (C$_6$-C$_{10}$)aryl, methoxy, ethoxy, linear or branched (C$_1$-C$_6$)alkoxy, (C$_6$-C$_{10}$)aryloxy, —NHCO(C$_1$-C$_6$)alkyl, —NHCO-perfluoro(C$_1$-C$_6$)alkyl, —SO$_2$N((C$_1$-C$_6$)alkyl)$_2$ and —NO$_2$;
Ar$_1$, Ar$_2$, Ar$_3$ and Ar$_4$ are the same or different and each independently selected from the group consisting of substituted or unsubstituted phenyl, substituted or unsubstituted biphenyl and substituted or unsubstituted naphthyl;
wherein said substituents are selected from the group consisting of methyl, ethyl, iso-propyl, tert-butyl and phenyl.

Generally, any of the latent organo-transition metal catalyst that would bring about ring open metathesis polymerization of the monomers of formula (I) can be employed in the composition of this invention. More specifically, organoruthenium or organo-osmium compounds that show little or no activity at ambient temperatures can be employed. That is, the latent catalysts that are stable at or near room temperature are more suitable in the composition of this invention. The latent catalysts may be activated by a variety of conditions, including without any limitation thermal, acid, light and chemical activation. The chemical activation may include use of thermal acid generator or photo acid generators.

Another approach of rendering ROMP catalyst dormant is by deactivating the catalyst by addition of suitable deactivating agent, such as for example, photo base generator. The catalyst is reactivated again by the use of thermal acid generator or photo acid generator. Another approach in tuning the latency of a ROMP catalyst is by way of manipulating the N-heterocyclic carbene (NHC) ligand as further exemplified below. Accordingly, various different techniques as described herein can be employed to render the catalyst latent which can be activated later either photolytically or by thermal treatment or by chemical activation so as to facilitate fabrication of electronic devices as described herein.

Several of the latent catalysts that are suitable to be employed in the compositions of this invention are known in the literature or can be readily made by any of the known procedures in the art. See for example, Grubbs, et al., Organometallics, 2011, 30 (24): 6713-6717; Sutar et al., Angew. Chem. Int. Ed. 2016, 55, 764-767; Leitgeh, et al., Monatsh Chem (2014) 145:1513-1517; van Hensbergen, et al., J. Mater. Chem. C. 2015, 3, 693-702; Grubbs, et al., J. Am. Chem. Soc., 2009, 131, 203802039; Zak, et al., Eur. J. Inorg. Chem., 2014, 1131-1136; Gawin, et al., ACS Catal. 2017, 7, 5443-5449. Further examples of such catalysts can also be found in U.S. Pat. No. 9,328,132, pertinent portions of which are incorporated herein by reference. Accordingly, a few of the exemplary latent catalysts, which are organoruthenium compounds, without any limitation maybe selected from the group consisting of:

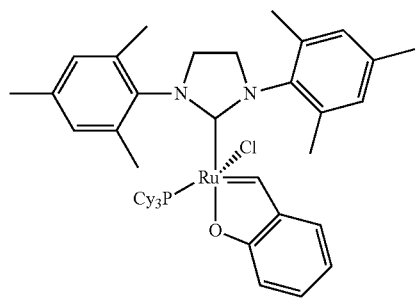

1,3-bis(2,4,6-trimethylphenylimidazolidin-2-ylidene)(tricyclohexylphosphine)-(2-oxobenzylidene)ruthenium(VI) chloride;

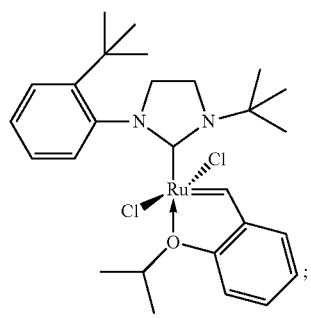

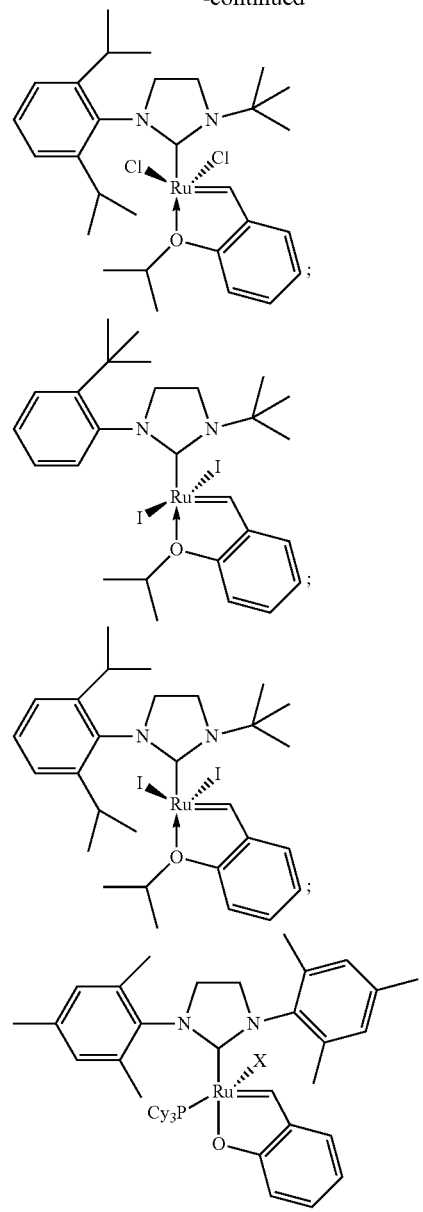

where X=halogen, —OR$_a$, —O(CO)R$_a$ —OSO$_2$R$_a$, where R$_a$ is (C$_1$-C$_{12}$)alkyl, (C$_3$-C$_{12}$)cycloalkyl, (C$_6$-C$_{14}$)aryl, see, for example, U.S. Pat. No. 9,328,132, for example when X=I, 1,3-bis(2,4,6-trimethylphenylimidazolidin-2-ylidene)(tricyclohexylphosphine)-(2-oxobenzylidene)ruthenium(VI) iodide;

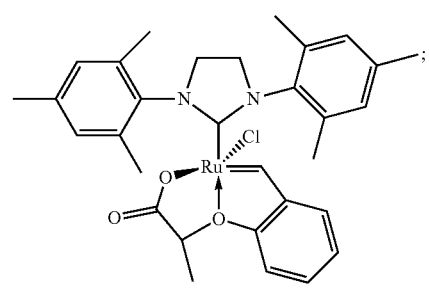

-continued

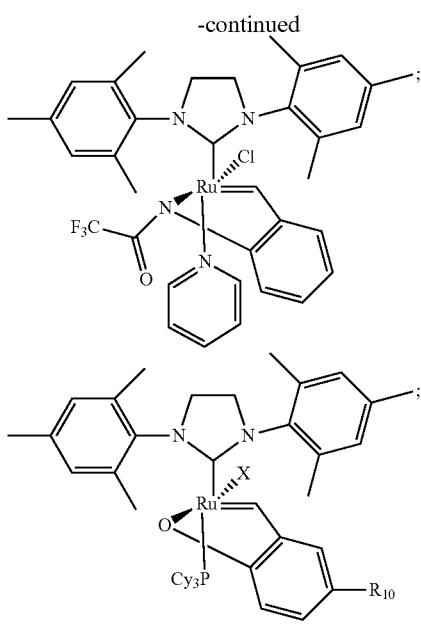

where X is Cl or I and $R_{10}$ is hydrogen, $NO_2$ or Cl;

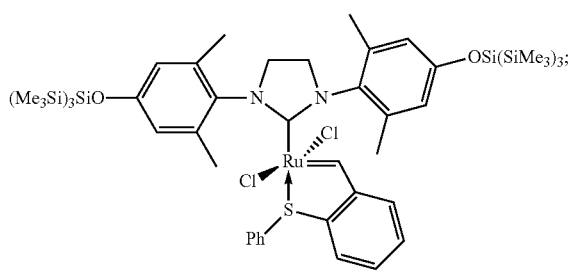

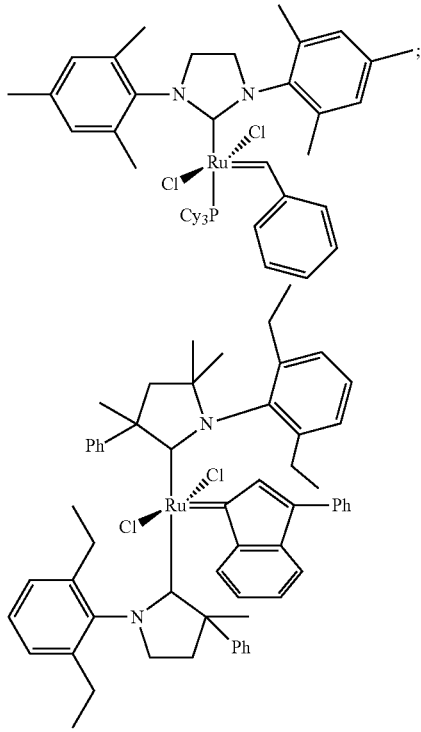

bis-[1-(2,6-diethylphenyl)-3-phenyl-3-methyl-5,5'-dimethyl-2-imidazolidinylidene]dichloro(3-phenyl-1H-inden-1-ylidene) ruthenium;

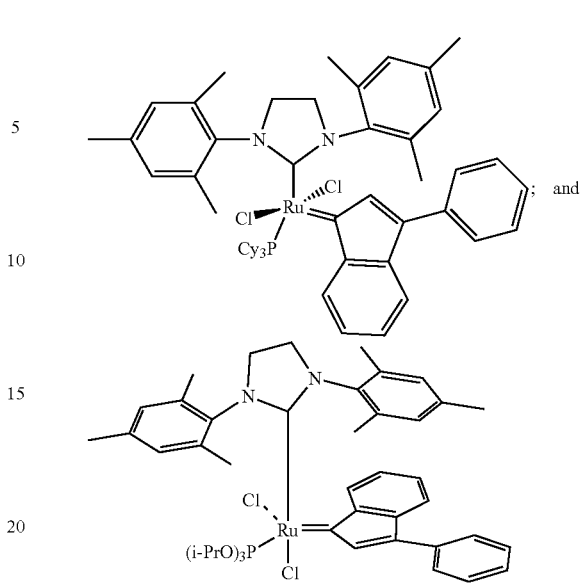

cis-[1,3-bis(2,4,6-trimethylphenyl)-2-imidazolidinylidene] dichloro(3-phenyl-1H-inden-1-ylidene)(triisopropylphosphite)ruthenium(II), commercially available from Umicore.

As noted, the composition of this invention further contains one or more additives selected from the group consisting of a photoactive acid generator, a photoactive base generator, a thermal acid generator, a thermal base generator and a mixture in any combination thereof. Surprisingly it has now been found that certain of the known photoactive or thermally active compounds, such as for example, photoacid generators or photobase generators can be used for this purpose.

In some embodiments the photoacid generator of the formula (V) is employed in the composition of this invention:

Wherein $Aryl_1$ and $Aryl_2$ are the same or different and are independently selected from the group consisting of substituted or unsubstituted phenyl, biphenyl and naphthyl; Hal is iodine or bromine; and $An^{\ominus}$ is a weakly coordinating anion (WCA) which is weakly coordinated to the cation complex. More specifically, the WCA anion functions as a stabilizing anion to the cation complex. The WCA anion is relatively inert in that it is non-oxidative, non-reducing, and non-nucleophilic. In general, the WCA can be selected from borates, phosphates, arsenates, antimonates, aluminates, boratobenzene anions, carborane, halocarborane anions, sulfonamidate and sulfonates.

Representative examples of the compounds of formula (V) may be listed as follows:

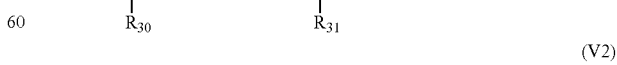

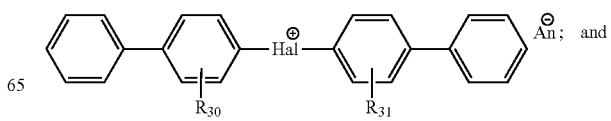

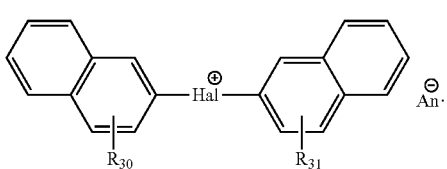

(V3)

Wherein $R_{30}$ and $R_{31}$ are the same or different and independently of each other selected from methyl, ethyl, linear or branched $(C_3\text{-}C_{12})$alkyl, $(C_3\text{-}C_{12})$cycloalkyl, $(C_6\text{-}C_{12})$bicycloalkyl, $(C_7\text{-}C_{14})$tricycloalkyl, $(C_6\text{-}C_{10})$aryl, $(C_6\text{-}C_{10})$aryl $(C_1\text{-}C_3)$alkyl, $(C_1\text{-}C_{12})$alkoxy, $(C_3\text{-}C_{12})$cycloalkoxy, $(C_6\text{-}C_{12})$bicycloalkoxy, $(C_7\text{-}C_{14})$tricycloalkoxy, $(C_6\text{-}C_{10})$aryloxy$(C_1\text{-}C_3)$alkyl and $(C_6\text{-}C_{10})$-aryloxy. It should further be noted that more than one $R_{30}$ and $R_{31}$ substituent can be present in aforementioned compounds of formula (V1), (V2) or (V3).

Similarly, various known sulfonium salts and quaternary ammonium salts can also be employed. Various thermal base generators as well as photobase generators can also be employed. Representative examples of such thermal base generators can be found in U.S. Pat. No. 9,690,196, pertinent portions of which are incorporated herein by reference. Representative examples of photobase generators can be found in U.S. Patent Application Publication No. US-2016-0238932-A1, pertinent portions of which are incorporated herein by reference.

Non-limiting examples of suitable additives that may be employed in the composition of this invention are listed below:

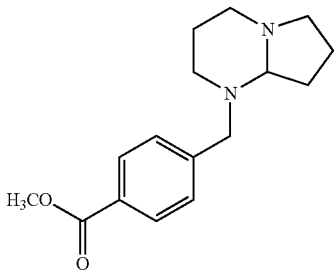 [SMILES: COC(=O)c1ccc(CN2CCCN3CCCC32)cc1]

methyl 4-(1-methyl)octahydropyrrolo[1,2-a]pyrimidine benzoate, commercially available as CGI 1293 from BASF;

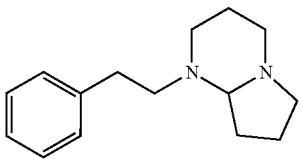 [SMILES: c1ccc(CCN2CCCN3CCCC32)cc1]

1-(1-phenylethyl)octahydropyrrolo[1,2-a]pyrimidine, commercially available as CGI 90 from BASF;

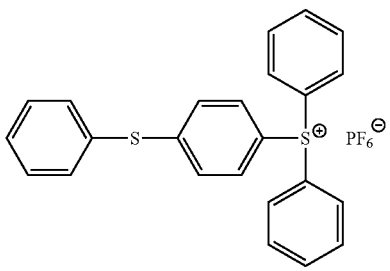

(4-thiophenyl)phenyl-diphenylsulfonium hexafluorophosphate; and

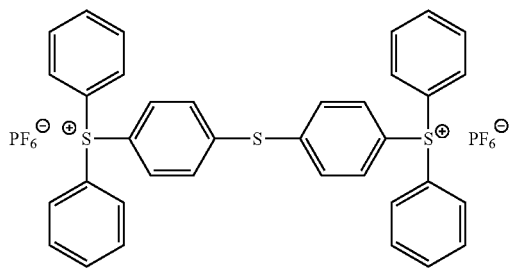

bis-(triphenylsulfonium) sulfide bis-hexafluorophosphate (collectively TS-HFP);

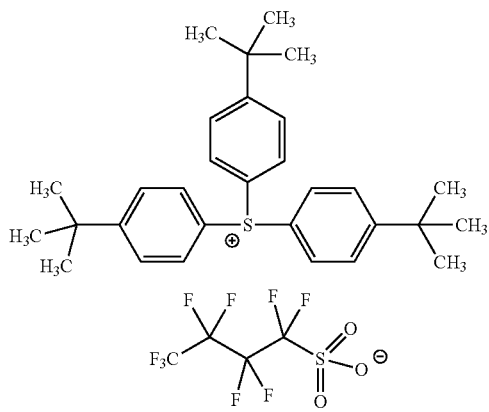 [SMILES: CC(C)(C)c1ccc([S+](c2ccc(C(C)(C)C)cc2)c2ccc(C(C)(C)C)cc2)cc1 ; O=S(=O)([O-])C(F)(F)C(F)(F)C(F)(F)C(F)(F)F]

tris(4-tert-butylphenyl)sulfoniumperfluoro-1-butane-sulfonate (TTBPS-PFBS);

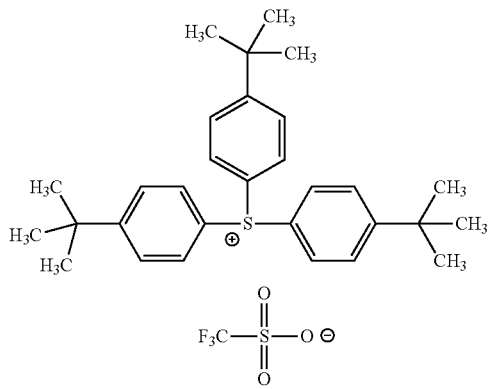 [SMILES: CC(C)(C)c1ccc([S+](c2ccc(C(C)(C)C)cc2)c2ccc(C(C)(C)C)cc2)cc1 ; O=S(=O)([O-])C(F)(F)F]

tris(4-tert-butylphenyl)sulfonium triflate (TTBPS-TF);

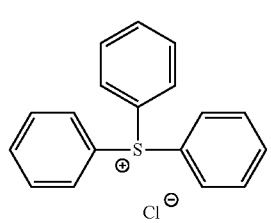 [SMILES: c1ccc([S+](c2ccccc2)c2ccccc2)cc1 ; [Cl-]]

triphenylsulfonium chloride (TSP-Cl);

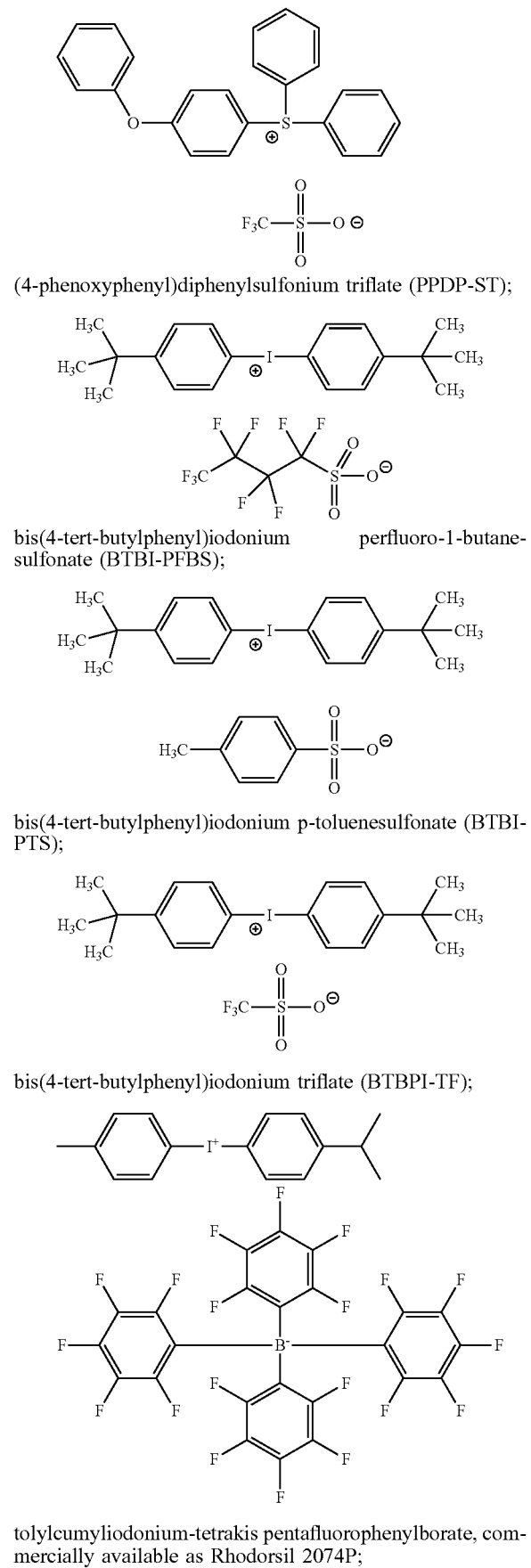

(4-phenoxyphenyl)diphenylsulfonium triflate (PPDP-ST);

bis(4-tert-butylphenyl)iodonium perfluoro-1-butanesulfonate (BTBI-PFBS);

bis(4-tert-butylphenyl)iodonium p-toluenesulfonate (BTBI-PTS);

bis(4-tert-butylphenyl)iodonium triflate (BTBPI-TF);

tolylcumyliodonium-tetrakis pentafluorophenylborate, commercially available as Rhodorsil 2074P;

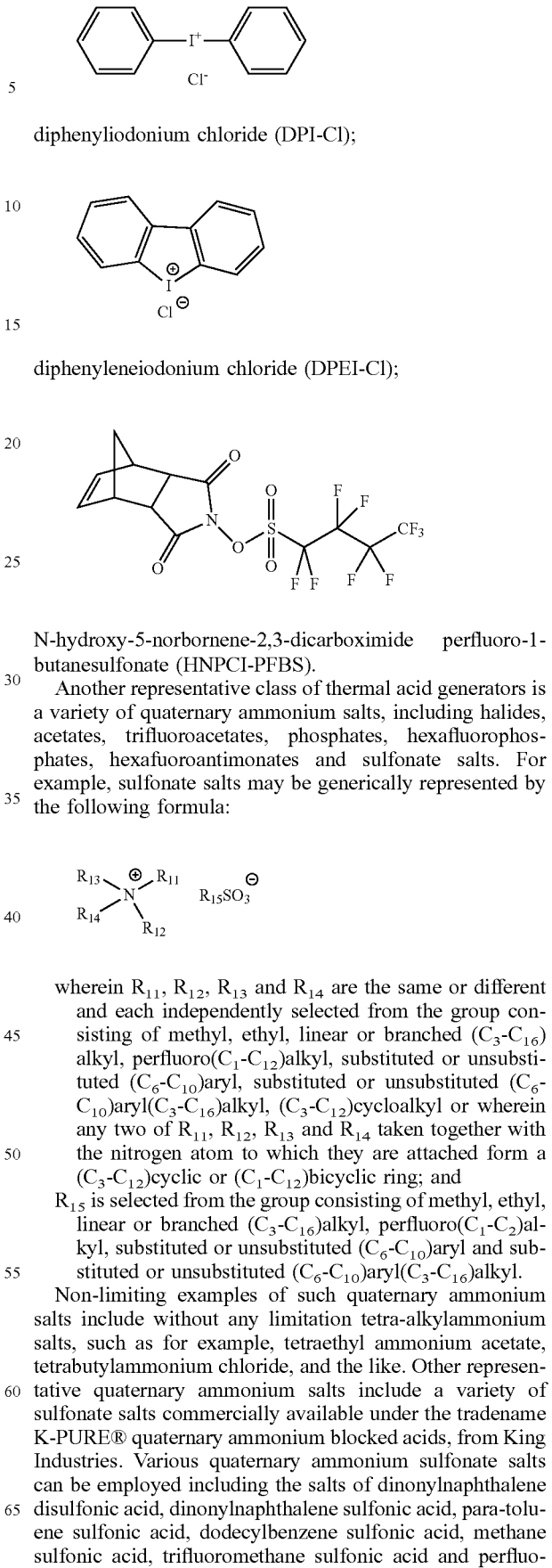

diphenyliodonium chloride (DPI-Cl);

diphenyleneiodonium chloride (DPEI-Cl);

N-hydroxy-5-norbornene-2,3-dicarboximide perfluoro-1-butanesulfonate (HNPCI-PFBS).

Another representative class of thermal acid generators is a variety of quaternary ammonium salts, including halides, acetates, trifluoroacetates, phosphates, hexafluorophosphates, hexafuoroantimonates and sulfonate salts. For example, sulfonate salts may be generically represented by the following formula:

wherein $R_{11}$, $R_{12}$, $R_{13}$ and $R_{14}$ are the same or different and each independently selected from the group consisting of methyl, ethyl, linear or branched $(C_3$-$C_{16})$ alkyl, perfluoro$(C_1$-$C_{12})$alkyl, substituted or unsubstituted $(C_6$-$C_{10})$aryl, substituted or unsubstituted $(C_6$-$C_{10})$aryl$(C_3$-$C_{16})$alkyl, $(C_3$-$C_{12})$cycloalkyl or wherein any two of $R_{11}$, $R_{12}$, $R_{13}$ and $R_{14}$ taken together with the nitrogen atom to which they are attached form a $(C_3$-$C_{12})$cyclic or $(C_1$-$C_{12})$bicyclic ring; and $R_{15}$ is selected from the group consisting of methyl, ethyl, linear or branched $(C_3$-$C_{16})$alkyl, perfluoro$(C_1$-$C_2)$alkyl, substituted or unsubstituted $(C_6$-$C_{10})$aryl and substituted or unsubstituted $(C_6$-$C_{10})$aryl$(C_3$-$C_{16})$alkyl.

Non-limiting examples of such quaternary ammonium salts include without any limitation tetra-alkylammonium salts, such as for example, tetraethyl ammonium acetate, tetrabutylammonium chloride, and the like. Other representative quaternary ammonium salts include a variety of sulfonate salts commercially available under the tradename K-PURE® quaternary ammonium blocked acids, from King Industries. Various quaternary ammonium sulfonate salts can be employed including the salts of dinonylnaphthalene disulfonic acid, dinonylnaphthalene sulfonic acid, para-toluene sulfonic acid, dodecylbenzene sulfonic acid, methane sulfonic acid, trifluoromethane sulfonic acid and perfluorobutane sulfonic acid. Representative examples of such quaternary ammonium sulfonates include without any limitation N,N,N-trimethyl-N-benzyl triflate, N-benzyl-N,N-dimethyl-4-nitro-N-phenyl nonafluorobutane sulfonate, 4-methyl-N-benzyl-N,N-dimethyl-N-phenyl triflate, N-benzyl-N,N-dimethyl-N-phenyl triflate, 4-methoxy-N-benzyl-N,N-dimethyl-N-phenyl triflate, and the like. A few of these quaternary ammonium salts are available commercially, for example, TAG-2678, TAG-2689 and TAG-2700, all from King Industries.

Another class of quaternary salts includes various pyridinium sulfonate salts of the formula shown below. Such pyridinium salts may also include other anions such as the ones mentioned above, i.e., halides, acetates, trifluoroacetates, phosphates, hexafluorophosphates, hexafuoroantimonates and the like.

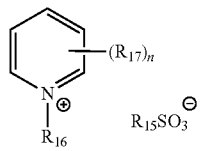

wherein n is an integer from 0 to 5;

$R_{15}$ is as defined above;

$R_{16}$ selected from the group consisting of methyl, ethyl, linear or branched $(C_3-C_{16})$alkyl, perfluoro$(C_1-C_2)$alkyl and substituted or unsubstituted $(C_6-C_{10})$aryl and substituted or unsubstituted $(C_6-C_{10})$aryl$(C_3-C_{16})$alkyl; and $R_{17}$ is independently selected from the group consisting of methyl, ethyl, linear or branched $(C_3-C_6)$alkyl, perfluoro $(C_1-C_2)$alkyl, substituted or unsubstituted $(C_6-C_{10})$aryl and substituted or unsubstituted $(C_6-C_{10})$aryl$(C_3-C_{16})$alkyl.

Representative examples of such pyridinium salts include without any limitation pyridinium triflate, 1-(4-methoxyphenyl)methyl-pyridinium triflate, and the like.

However, any of the other known photoactive or thermally active compounds which generate the activator for the latent catalysts employed herein can also be used in the composition of this invention. All such compounds are part of this invention.

In another aspect of this invention there is further provided a composition as described herein which includes a dispersion of nanoparticles. In this aspect of the invention it has now been surprisingly found that there is no need to add any of the additives as described hereinabove. That is in this aspect of the invention the composition encompasses one or more monomer of formula (I), the organo-transition compound such as organo-ruthenium compound as described herein and a dispersion of nanoparticles. This composition when subjected to higher temperature, such as for example from about 50° C. to about 100° C. or higher undergoes mass ring open-metathesis polymerization (ROMP) to form a transparent film.

Any of the nanoparticles known in the literature that would bring about such a change can be used in this aspect of the invention. For example, U.S. Pat. No. 8,592,511 discloses certain nanoparticles that are suitable for this aspect of the invention, pertinent portion of which is incorporated herein by reference. Accordingly, such nanoparticles include without any limitation at least one of hafnium oxide, zirconium oxide, titanium oxide, hafnium-zirconium oxide and titanium-zirconium oxide.

In some embodiments of this invention it has now been found that various zirconium oxide nanoparticles are suitable to form the composition of this invention which readily forms transparent films as disclosed herein.

As noted, surprisingly, it has now been found that employing a suitable additive which is either photoactive or thermally active initiator can trigger the mass polymerization of the monomers when the composition is subjected to either an elevated temperature or to a suitable radiation. As further noted any of the photoactive or thermally active compounds that can bring about such an effect can be employed in the composition of this invention.

In some embodiments of this invention the composition of this invention may additionally contain a photosensitizer compound which can activate the organo-transition compound in order to facilitate the mass polymerization of the monomers of formula (I). For this purpose, any suitable sensitizer compound can be employed in the compositions of the present invention. Such suitable sensitizer compounds include, photosensitizers, such as, anthracenes, phenanthrenes, chrysenes, benzpyrenes, fluoranthenes, rubrenes, pyrenes, xanthones, indanthrenes, thioxanthen-9-ones, and mixtures thereof. In some exemplary embodiments, suitable sensitizer components include 2-isopropyl-9H-thioxanthen-9-one, 4-isopropyl-9H-thioxanthen-9-one, 1-chloro-4-propoxythioxanthone (commercially sold under the name CPTX from Lambson), phenothiazine, and mixtures thereof. Generally, photosensitizers absorb energy from the radiated light source and transfers that energy to the desirable substrate/reactant, which in the present invention is the photoactive initiator employed in the composition of this invention.

Any amount of latent catalyst and the additive initiator can be employed in the composition of this invention which will bring about the intended result. Generally, the molar ratio of monomer:latent catalyst:additive is in the range of 10,000:1:1 to 5,000:1:1 or lower. In some other embodiments such monomer:latent catalyst:photo or thermal active initiator is 15,000:1:1, 20,000:1:1 or higher. Again, as noted, when nanoparticles are employed then there may not be a need to use any other additives to activate the latent catalyst.

Advantageously, it has further been found that the composition according to this invention forms a substantially transparent film when mass polymerized, generally, at a temperature from 50° C. to 100° C. or higher, for example, 150° C. or 200° C. and so on. That is to say, that when the composition of this invention is heated to certain elevated temperature, the monomers undergo mass polymerization to form films which are substantially transparent to visible light. That is, most of the visible light is transmitted through the film. In some embodiments such film formed from the composition of this invention exhibits a transmission of equal to or higher than 90 percent of the visible light. In some other embodiments such film formed from the composition of this invention exhibits a transmission of equal to or higher than 95 percent of the visible light. It should be further noted that any temperature that is suitable to carry out this mass polymerization can be employed, such as for example, 50° C. to 100° C. as indicated above. However, any temperature below 50° C. or higher than 100° C. can also be employed. In some embodiments the temperature employed to 60° C., 70° C., 80° C., 90° C. or higher than 120° C.

In some other embodiments the composition of this invention undergoes mass polymerization when exposed to suitable UV irradiation to form a substantially transparent film. In yet other embodiments the composition of this invention undergoes mass polymerization when exposed to suitable UV irradiation at a temperature from 50° C. to 100° C. to form a substantially transparent film.

In another embodiment of this invention, the composition of this invention encompasses 5-phenethylbicyclo[2.2.1]hept-2-ene (PENB), 5-norbornenylmethyl-eugenol, 1,3-bis(2,4,6-trimethylphenylimidazolidin-2-ylidene)(tricyclohexylphosphine)-(2-oxobenzylidene)ruthenium(VI) iodide and a mixture of (4-thiophenyl)phenyl-diphenylsulfonium hexafluorophosphate and bis-(triphenylsulfonium) sulfide bis-hexafluorophosphate.

In another embodiment of this invention, the composition of this invention encompasses 5-phenethylbicyclo[2.2.1]hept-2-ene (PENB), 1,3-bis(2,4,6-trimethylphenylimidazolidin-2-ylidene)(tricyclohexylphosphine)-(2-oxobenzylidene)ruthenium(VI) iodide and N,N,N-trimethyl-N-benzyl triflate.

In yet another embodiment of this invention, the composition of this invention encompasses 5-norbornenylmethyl-eugenol, 1,3-bis(2,4,6-trimethylphenyl)-2-imidazolidinylidene)dichloro-(phenylmethylidene)(tricyclohexylphosphine)ruthenium and zirconium oxide nanoparticles.

In another embodiment of this invention, the composition of this invention encompasses 5-phenethylbicyclo[2.2.1]hept-2-ene (PENB), 1,3-bis(2,4,6-trimethylphenylimidazolidin-2-ylidene)(tricyclohexylphosphine)-(2-oxobenzylidene)ruthenium(VI) chloride and a mixture of (4-thiophenyl)phenyl-diphenylsulfonium hexafluorophosphate and bis-(triphenylsulfonium) sulfide bis-hexafluorophosphate.

In a further aspect of this invention there is provided a kit for forming a substantially transparent film. There is dispensed in this kit a composition of this invention. Accordingly, in some embodiments there is provided a kit in which there is dispensed one or more monomers of formula (I) and optionally one or more additives as described herein or optionally a dispersion of nanoparticles so as to obtain a desirable result and/or for intended purpose. Further, said kit comprises a latent catalyst as described herein. The monomers of formulae (I) are the ones as described hereinabove.

In some embodiments, the aforementioned kit encompasses two or more monomers of formula (I) distinct from one another as described hereinabove. In some other embodiments the kit of this invention encompasses at least two monomers wherein first monomer facilitates dissolution of the second monomer and/or the latent catalyst and the additives as described hereinabove. Any of the monomers of formula (I) as described herein can be used in this embodiment. The molar ratio of first and the second monomer of formula (I) contained in these components can vary and may range from 1:99 to 99:1, or 10:90 to 90:10, 20:80 to 80:20, 30:70 to 70:30, 60:40 to 40:60 or 50:50, and so on. In some other embodiments the kit may encompass a composition wherein dispensed more than two monomers of formula (I), each distinct from one another. Further, as noted the first monomer of formula (I) is completely soluble in the second monomer of formula (I) to form a clear solution at room temperature. In some embodiments the monomer mixture may become a clear solution at slightly elevated temperature, such as for example, 30° C. or 40° C. or 50° C., before they undergo mass polymerization. In another aspect of this embodiment of this invention the composition of this invention undergoes mass polymerization at a temperature of from 50° C. to 100° C. for a sufficient length of time to form a polymeric film. That is to say that the composition of this invention is poured onto a surface or onto a substrate which needs to be encapsulated, and heated to a temperature of 50° C. to 100° C. in order for the monomers to undergo polymerization to form a solid transparent polymer which could be in the form of a transparent film. Generally, as already noted above, such polymerization can take place at 50° C., 60° C., 70° C., 80° C., 90° C., 100° C. or higher. The heating can also be carried out in stages to trigger the polymerization, for example to 60° C. for 5 minutes, and then heating to 70° C. for 15 minutes and so on. By practice of this invention it is now possible to obtain polymeric films on such substrates which are substantially transparent film. The "substantially transparent film" as used herein means that the films formed from the composition of this invention are optically clear in the visible light. Accordingly, in some embodiments of this invention such films are having at least 90 percent of visible light transmission, in some other embodiments the films formed from the composition of this invention exhibit at least 95 percent of visible light transmission.

In some embodiments, the kit as described herein encompasses a composition, which contains 5-phenethylbicyclo[2.2.1]hept-2-ene (PENB), 5-norbornenylmethyl-eugenol, 1,3-bis(2,4,6-trimethylphenylimidazolidin-2-ylidene)(tricyclohexylphosphine)-(2-oxobenzylidene)ruthenium(VI) iodide and a mixture of (4-thiophenyl)phenyl-diphenylsulfonium hexafluorophosphate and bis-(triphenylsulfonium) sulfide bis-hexafluorophosphate.

In some other embodiments, the kit as described herein encompasses a composition, which contains 5-norbornenylmethyl-eugenol, 1,3-bis(2,4,6-trimethylphenyl)-2-imidazolidinylidene)dichloro-(phenylmethylidene)(tricyclohexylphosphine)ruthenium and zirconium oxide nanoparticles.

In another aspect of this invention there is further provided a composition comprising one or more monomers of formula (I), a latent catalyst, one or more additives which are a thermal or photoactive acid or base generators as described hereinabove. Any of the monomers of formula (I) as described hereinabove can be used in this aspect of the invention. The monomers of formula (I) featuring a refractive index of at least 1.5 and viscosity below 100 centipoise.

When more than two monomers of formula (I) are employed the first monomer is completely miscible with the second monomer and forms a clear solution. When the composition is heated to a temperature in the range of from 50° C. to 100° C. and optionally exposed to suitable irradiation forms a substantially transparent film having a transmission higher than 90 percent of the visible light.

In yet another aspect of this invention there is further provided a method of forming a substantially transparent film for the fabrication of a variety of optoelectronic device comprising:

forming a homogeneous clear composition comprising one or more monomers of formula (I), a latent catalyst and an additive selected from thermal or photoactive acid or base generator;

coating a suitable substrate with the composition or pouring the composition onto a suitable substrate to form a film; and heating the film to a suitable temperature to cause polymerization of the monomers.

The coating of the desired substrate to form a film with the composition of this invention can be performed by any of the coating procedures as described herein and/or known to one skilled in the art, such as by spin coating. Other suitable coating methods include without any limitation spraying, doctor blading, meniscus coating, ink jet coating and slot coating. The mixture can also be poured onto a substrate to form a film. Suitable substrate includes any appropriate substrate as is, or may be used for electrical, electronic or optoelectronic devices, for example, a semiconductor substrate, a ceramic substrate, a glass substrate.

Next, the coated substrate is baked, i.e., heated to facilitate the mass polymerization, for example to a temperature from 50° C. to 100° C. for about 1 to 60 minutes, although other appropriate temperatures and times can be used. In some embodiments the substrate is baked at a temperature of from about 60° C. to about 90° C. for 2 minutes to 10 minutes. In some other embodiments the substrate is baked at a temperature of from about 60° C. to about 90° C. for 5 minutes to 20 minutes.

The films thus formed are then evaluated for their optical properties using any of the methods known in the art. For example, the refractive index of the film across the visible spectrum can be measured by ellipsometry. The optical quality of the film can be determined by visual observation. Quantitatively the percent transparency can be measured by visible spectroscopy. Generally, the films formed according to this invention exhibit excellent optical transparent properties and can be tailored to desirable refractive index as described herein.

Accordingly, in some of the embodiments of this invention there is also provided a optically transparent film obtained by the mass polymerization of the composition as described herein. In another embodiment there is also provided an optoelectronic device comprising the transparent film of this invention as described herein.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:
PENB—5-phenethylbicyclo[2.2.1]hept-2-ene; Ru-I, 1,3-bis(2,4,6-trimethylphenyl-imidazolidin-2-ylidene)(tricyclohexylphosphine)-(2-oxobenzylidene)ruthenium(VI) chloride; Ru-II—1,3-bis(2,4,6-trimethylphenylimidazolidin-2-ylidene)(tricyclohexylphosphine)-(2-oxobenzylidene) ruthenium(VI) iodide; Ru—III—bis-[1-(2,6-diethylphenyl)-3-phenyl-3-methyl-5,5'-dimethyl-2-imidazolidinylidene] dichloro(3-phenyl-1H-inden-1-ylidene) ruthenium; Ru-IV—cis-[1,3-bis(2,4,6-trimethylphenyl)-2-imidazolidinylidene]dichloro(3-phenyl-1H-inden-1-ylidene)(triisopropylphosphite)ruthenium(II); CGI 1293—methyl 4-(1-methyl)octahydropyrrolo[1,2-a]pyrimidine benzoate; CGI 90—1-(1-phenylethyl)octahydropyrrolo[1,2-a]pyrimidine; TAG-2678—thermal acid generator from King Industries; TS-HFP—a mixture of (4-thiophenyl)phenyl-diphenylsulfonium hexafluorophosphate and bis-(triphenylsulfonium) sulfide bis-hexafluorophosphate; DPI-Cl—diphenyliodonium chloride; DPEI-Cl—diphenyleneiodonium chloride; PAG—photoacid generator; TAG-thermal acid generator.

Various monomers as used herein are either commercially available or can be readily prepared following the procedures as described in the co-pending U.S. patent application Ser. No. 15/253,980, filed Sep. 1, 2016.

The following Examples demonstrate that the compositions of this invention are quite stable at 35° C. for several days and can very readily be mass polymerized by heating to a temperature as specified below.

Example 1

Mass Polymerization of PENB

In a glass bottle, Ru-I (0.0021 g, 0.0025 mmol) was dissolved in PENB (5 g, 25.21 mmol) without solvent to form a clear solution, the monomer to catalyst ratio was at 10,000:1. To this solution was then added a solution of CGI 1293 (0.004 g 0.0075 mmol in 0.38 g acetone). The solution was UV light exposed (5 J/cm$^2$, broad band, 5 mins). The solution was free flowing even after 6 days at room temperature. To this was then added dilute HCl in acetone (HCl to CGI 1293 molar ratio was at 3:1). The solution gelled immediately. This clearly demonstrate that Ru-I can be made dormant with a base (i.e., CGI 1293) and then activated by addition of HCl.

Example 2

Mass Polymerization of PENB

The procedure of Example 1 was substantially repeated in Example 2, except for employing CGI 90 as the photobase to stabilize Ru-I. The clear solution thus obtained was again free flowing even after 6 days at room temperature and gelled immediately after addition of dilute HCl in acetone (HCl to CGI 1293 molar ratio was at 3:1).

Example 3

Mass Polymerization of PENB with Ru-II

The procedure of Example 1 was substantially repeated in Example 3, except for employing Ru-II as the catalyst and TS-HFP (0.007 g) was used as photo acid generator. The solution was stable and free flowing with no increase in viscosity for at least two hours. The solution was UV light exposed (5 J/cm$^2$, broad band, 5 minutes) and was heated to 100° C. for 1 hour at which time it gelled.

Examples 4-5

The procedures of Example 3 were substantially repeated in these Examples 4 and 5 except that different PAGs as listed in Table 1 were employed. The PAG solution was prepared by dissolving PAG in 0.5 g ethanol in Example 4 and no solvent was used in Example 5. The PAG to catalyst ratio was at 1:1. The mixtures with PAG were UV light exposed (5 J/cm$^2$, broad band 5 minutes). All reaction mixtures were heated at 100° C. for 1 hour. The results are summarized in Table 1.

TABLE 1

| Example No. | PAG | Solvent | UV exposure (1 J/cm$^2$) | Heating at 100° C. for 1 h |
|---|---|---|---|---|
| 4 | DPI-Cl | ethanol | Liquid | Solid |
| 5 | DPEI-Cl | none | Liquid | Solid |

Example 6

In a glass bottle was placed Ru-IV (0.0022 g, 0.0025 mmol) dissolved in 0.05 g anhydrous toluene. The catalyst solution was mixed with PENB (5 g, 25.21 mmol). The monomer to catalyst ratio was at 10000:1. To this solution was added triethyl phosphite (0.001 g). The triethyl phosphite to catalyst mole ratio was at 2:1. The solution viscosity did not change for 2 days at 30° C. The reaction mixture was heated to 100° C. and gelled after 15 min.

Example 7

Mass Polymerization of PENB/EuOHNB/Nanoparticles

In a glass bottle were placed PENB (2.5 g, 12.61 mmol), EuOHNB (2.5 g, 10.86 mmol) and zirconia ($ZrO_2$) nanoparticle (smaller than 20 nm, Pixelligent) 50 wt. % dispersion in ethyl acetate (10 g). The solvent was stripped off using a rotary evaporator at 60° C. (10 torr) to give a clear Transparent solution. The refractive index of the solution was measured using Abbe refractometer (Atago), and was 1.61 (the refractive index of monomer mixture alone was 1.56). To this was then injected a solution of 1,3-bis(2,4,6-trimethylphenyl)-2-imidazolidinylidene)dichloro(phenylmethylene)(tricyclohexyl-phosphine)ruthenium (0.00415 g, 0.005 mmol in 0.05 g anhydrous toluene) using a syringe. The monomer to catalyst ratio was kept at 5000:1. The composition was heated for 1 hour at 100° C. The inorganic residue of cured samples was measured by dynamic TGA at 600° C. in air and was determined to be 38 wt. %.

Example 8

Preparation of a Thin (500 nm) Nanocomposite Film

The composition of Example 8 was diluted with toluene and spin coated at a spin speed of 2000 rpm for 30 seconds on a 2-inch silicon wafer. The film was heated at 120° C. on a hot plate for 5 minutes to obtain a film thickness of around 500 nm. The refractive index of cured film was measured using Ellipsometry at 589 nm and was 1.65.

Examples 9-18

Mass Polymerization of Norbornene Monomers/$ZrO_2$ Nanoparticles

The procedures of Examples 7 and 8 were substantially repeated in these Examples 9 to 18 except that various different monomers and $ZrO_2$ nanoparticles as listed in Table 2 were employed.

The monomer used in each of these Examples 9 to 18, the type of nanoparticles used (all from Pixelligent), nanoparticles loading, the refractive index of solution and films, and the loading levels of $ZrO_2$ in the film as measured by the residue percentage from dynamic TGA of the resulting nanocomposites are summarized in Table 2.

TABLE 2

| Example No. | Monomer (g, mmol) (RI) | Nanoparticles (Type) | Nanoparticle loading, wt. % | Solution RI | Polymer film RI (residue, %) |
|---|---|---|---|---|---|
| 9 | EuOHNB (5, 21.7) | $ZrO_2$ (PCN-50-ETA) | 50 | — | — |
| 10 | AOAONB (5, 9.7) | $ZrO_2$ (PCPG-2-50-ETA) | 50 | — | — |
| 11 | PENB/EuOHNB, 50/50 mole ratio (2.5/2.5, 12.6/10.9) (1.56) | ZrO2 (PCPG-2-50-ETA) | 50 | 1.61 | 1.65 (38) |
| 12 | PENB/EuOHNB, 50/50 mole ratio (2.5/2.5, 12.6/10.9) (1.56) | $ZrO_2$ (PCPG-2-50-ETA) | 75 | 1.65 | 1.71 (67) |
| 13 | PENB/EuOHNB, 75/25 mole ratio (3.75/1.25, 18.9/5.4) (1.54) | $ZrO_2$ (PCPG-2-50-ETA) | 50 | 1.6 | 1.64 (48) |
| 14 | PENB/EuOHNB, 75/25 mole ratio (3.75/1.25, 18.9/5.4) (1.54) | $ZrO_2$ (PCPG-2-50-ETA) | 75 | 1.67 | 1.71 (58) |
| 15 | PENB/EuOHNB, 50/50 mole ratio (2.5/2.5, 12.6/10.9) (1.56) | $ZrO_2$ (PCPB-2-50-ETA) | 50 | 1.61 | 1.65 (42) |
| 16 | PENB/EuOHNB, 75/25 mole ratio (3.75/1.25, 18.9/5.4) (1.54) | $ZrO_2$ (PCPB-2-50-ETA) | 50 | 1.6 | 1.65 (44) |
| 17 | PENB/EuOHNB, 50/50 mole ratio (2.5/2.5, 12.6/10.9) (1.56) | $ZrO_2$ (PCPN-50-ETA) | 50 | 1.6 | 1.66 (42) |
| 18 | PENB/EuOHNB, 75/25 mole ratio (3.75/1.25, 18.9/5.4) (1.54) | $ZrO_2$ (PCPN-50-ETA) | 50 | 1.6 | 1.65 (39) |

RI—refractive index

Example 19

PENB Film with Ru-III

Ru-III as described herein was dissolved in PENB (5 g, 25.21 mmol). The monomer to catalyst ratio was 10000:1. The solution was dispensed on a 5-inch bare silicon wafer with 100 m glass bead spacers and covered with a second wafer. The stack was heated at 100° C. for 1 hour in an oven. After cooling, the film was removed from the wafers in water and dried at room temperature and its mechanical properties were measured and are summarized in Table 3.

Examples 20-21

Mechanical Properties of PENB and PENB/EuOHNB/$ZrO_2$ Nanoparticles Films

PENB/EuOHNB (50/50 weight ratio) (5 g, 23.47 mmol) were dissolved in $ZrO_2$ nanoparticles (PCPB-2-50-ETA, Pixelligent) solution in ethyl acetate (10 g). The solvent was removed using a rotary evaporator at 60° C. (10 torr). To this composition was added the respective ruthenium catalyst as listed in Table 3 to form a clear solution. The monomer to catalyst molar ratio was kept at 10000:1. The compositions were dispensed on a 5-inch bare silicon wafer with 100 μm glass bead spacers and covered with a second wafer. The stack was cured at 100° C. for 1 hour in an oven. The films were removed from the wafers in water and dried at room temperature. Mechanical properties of the tested films are summarized in Table 3.

TABLE 3

| Example No. | Monomer | Nanoparticles loading, wt. % | Catalyst | Young's modulus, GPa | ETB, % | Tensile Stress, MPa |
|---|---|---|---|---|---|---|
| 19 | PENB | — | Ru-III | 1.6 | 270 | 29 |
| 20 | PENB/EuOH NB, 50/50 | 50 | Ru-III | 1.8 | 98 | 40 |
| 21 | PENB/EuOH NB, 50/50 | 50 | Ru-II | 2 | 80 | 36 |

ETB—elongation to break

Comparative Example 1

In a glass bottle, Ru-I (0.0021 g, 0.0025 mmol) was dissolved in PENB (5 g, 25.21 mmol) without solvent to form a clear solution, the monomer to catalyst molar ratio was at 10,000:1. The solution gelled at room temperature in about 2 hours.

Comparative Example 2

In a glass bottle was placed Ru-IV (0.0022 g, 0.0025 mmol) dissolved in 0.05 g anhydrous toluene. The catalyst solution was mixed with PENB (5 g, 25.21 mmol). The monomer to catalyst ratio was at 10000:1. The solution gelled at 30° C. after 24 hours.

Comparative Example 3

In a glass bottle was placed Ru-IV (0.0022 g, 0.0025 mmol) dissolved in 0.05 g anhydrous toluene. The catalyst solution was mixed with PENB (5 g, 25.21 mmol). The monomer to catalyst ratio was at 10000:1. The reaction mixture was heated to 100° C. it gelled after 10 min.

Comparative Example 4

In a glass bottle Ru-II (0.0022 g, 0.0025 mmol) was dissolved in PENB (5 g, 25.21 mmol). The monomer to catalyst ratio was at 10000:1. The solution was free flowing at room temperature and was then heated to 100° C. for 1 hour, the solution was still free flowing indicating that the catalyst was still inactive under these conditions.

Comparative Example 5

In a glass bottle Ru-II (0.0022 g, 0.0025 mmol) was dissolved in a mixture of PENB (2.5 g, 12.6 mmol)/Eu-OHNB (2.5 g, 10.9 mmol). The monomer to catalyst ratio was at 10000:1. The solution was free flowing at room temperature and was then heated to 100° C. for 1 hour, the solution was still free flowing indicating that the catalyst was still inactive under these conditions.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A composition comprising:
a) one or more monomers of formula (I):

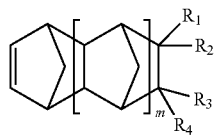

(I)

wherein:
m is an integer 0, 1 or 2;
$R_1$, $R_2$, $R_3$ and $R_4$ are the same or different and each independently selected from the group consisting of hydrogen, halogen, methyl, ethyl, linear or branched ($C_3$-$C_{16}$)alkyl, perfluoro($C_1$-$C_{12}$)alkyl, hydroxy($C_1$-$C_{16}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_6$)alkyl, perfluoro($C_6$-$C_{10}$)aryl, perfluoro($C_6$-$C_{10}$)aryl($C_1$-$C_3$)alkyl, tri($C_1$-$C_6$)alkoxysilyl and a group of formula (A):

—Z-Aryl     (A)

wherein:
Z is a bond or a group selected from the group consisting of:
($CR_5R_6)_a$, $O(CR_5R_6)_a$, $(CR_5R_6)_aO$, $(CR_5R_6)_a$—O—$(CR_5R_6)_b$, $(CR_5R_6)_a$—O—$(SiR_5R_6)_b$, $(CR_5R_6)_a$—(CO)O—$(CR_5R_6)_b$, $(CR_5R_6)_a$—O(CO)—$(CR_5R_6)_b$, $(CR_5R_6)_a$—(CO)—$(CR_5R_6)_b$, where a and b are integers which may be the same or different and each independently is 1 to 12;
$R_5$ and $R_6$ are the same or different and each independently selected from the group consisting of hydrogen, methyl, ethyl, linear or branched ($C_3$-$C_6$)alkyl, hydroxy, methoxy, ethoxy, linear or branched ($C_3$-$C_6$)alkyloxy, acetoxy, ($C_2$-$C_6$)acyl, hydroxymethyl, hydroxyethyl, linear or branched hydroxy($C_3$-$C_6$)alkyl, phenyl and phenoxy;
Aryl is phenyl or phenyl substituted with one or more of groups selected from the group consisting of methyl, ethyl, linear or branched ($C_3$-$C_6$)alkyl, hydroxy, methoxy, ethoxy, linear or branched ($C_3$-$C_6$)alkyloxy, acetoxy, ($C_2$-$C_6$)acyl, hydroxymethyl, hydroxyethyl, linear or branched hydroxy($C_3$-$C_6$)alkyl, phenyl and phenoxy;
b) a latent organo-ruthenium compound selected from the group consisting of:
a compound of formula (IIIA):

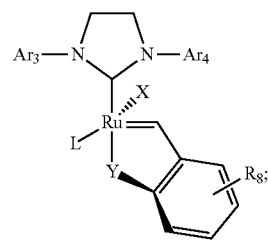

(IIIA)

and a compound of formula (IIIC):

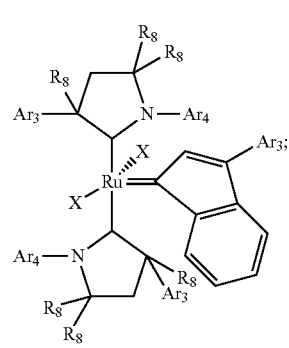

(IIIC)

wherein:

X is selected from the group consisting of halogen, —OR$_a$, —O(CO)R$_a$ —OSO$_2$R$_a$, where R$_a$ is (C$_1$-C$_{12}$) alkyl, (C$_3$-C$_{12}$)cycloalkyl or (C$_6$-C$_{14}$)aryl;

Y is O;

L is PR$_3$, where R is independently selected from the group consisting of isopropyl, sec-butyl, tert-butyl, cyclohexyl, bicyclo(C$_5$-C$_{10}$)alkyl, phenyl, benzyl, iso-propoxy, sec-butoxy, tert-butoxy, cyclohexyloxy, phenoxy and benzyloxy;

R$_8$ is selected from the group consisting of halogen, hydrogen, methyl, ethyl, linear or branched (C$_1$-C$_6$) alkyl, (C$_6$-C$_{10}$)aryl, methoxy, ethoxy, linear or branched (C$_1$-C$_6$)alkoxy, (C$_6$C$_{10}$)aryloxy, —NHCO(C$_1$-C$_6$)alkyl, —NHCO—perfluoro(C$_1$-C$_6$)alkyl, —SO$_2$N((C$_1$-C$_6$)alkyl)$_2$ and —NO$_2$;

Ar$_3$ and Ar$_4$ are the same or different and each independently selected from the group consisting of substituted or unsubstituted phenyl, substituted or unsubstituted biphenyl and substituted or unsubstituted naphthyl;

wherein said substitutents are selected from the group consisting of methy, ethyl, iso-propyl, tert-butyl and phenyl; and c) a dispersion comprising nanoparticles.

2. The composition according to claim 1, wherein said nanoparticles comprised of at least one of hafnium oxide, zirconium oxide, titanium oxide, hafnium-zirconium oxide, and titanium-zirconium oxide.

3. The composition according to claim 1, wherein the latent organo-ruthenium compound is selected from the group consisting of the compound of formula (IIIA) and the compound of formula (IIC):

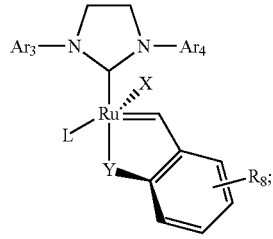
(IIIA)

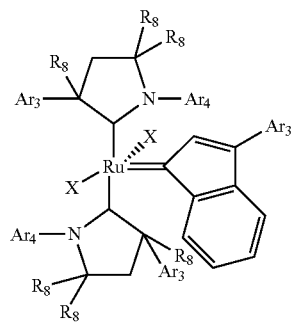
(IIC)

wherein:

X is selected from the group consisting of chlorine and iodine;

L is PR$_3$, where R is independently selected from the group consisting of isopropyl, sec-butyl, tert-butyl, and cyclohexyl.

4. The composition according to claim 1, wherein the latent organo-ruthenium compound is selected from the group consisting of:

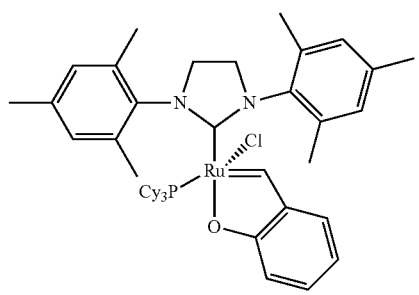

1,3-bis(2,4,6-trimethylphenylimidazolidin-2-ylidene)(tricyclohexylphosphine)-(2-oxobenzylidene)ruthenium(VI) chloride;

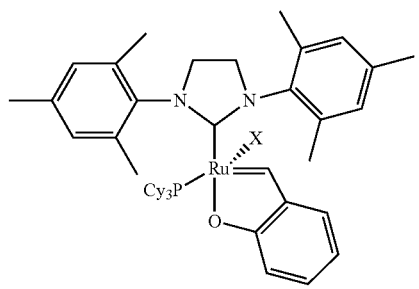

where X=halogen, —OR$_a$, —O(CO)R$_a$—OSO$_2$R$_a$, where R$_a$ is (C$_1$-C$_{12}$)alkyl, (C$_3$-C$_{12}$)cycloalkyl, (C$_6$-C$_{14}$)aryl;

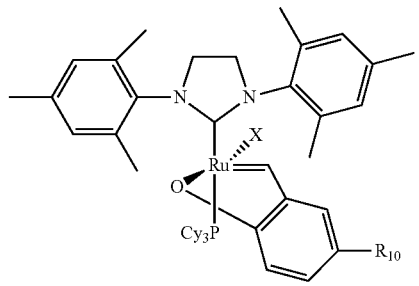

where X is Cl or I and R$_{10}$ is hydrogen, NO$_2$ or Cl; and

5. The composition according to claim 1, wherein the latent organo-ruthenium compound is selected from the group consisting of:

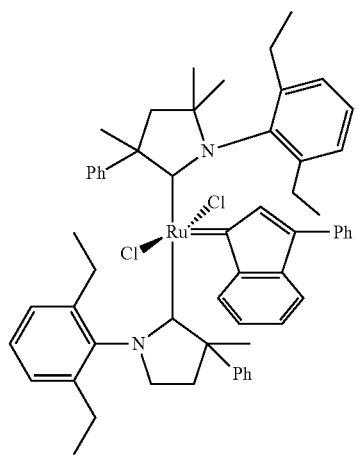

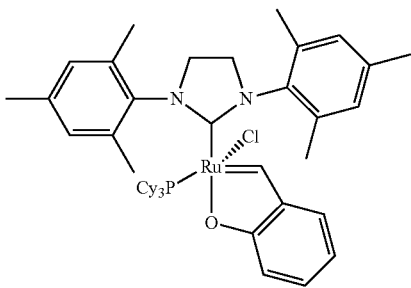

1,3-bis(2,4,6-trimethylphenylimidazolidin-2-ylidene)(tricyclohexylphosphine)-(2-oxobenzylidene)ruthenium(VI) chloride;

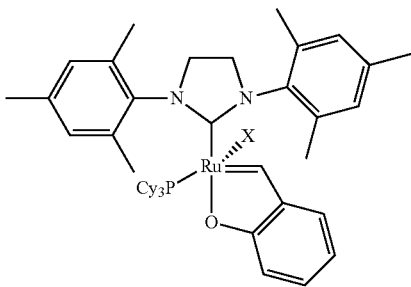

where X=iodine;

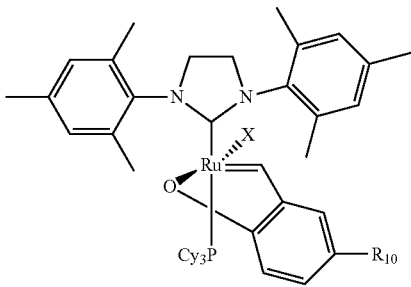

where X is Cl or I and R$_{10}$ is hydrogen; and

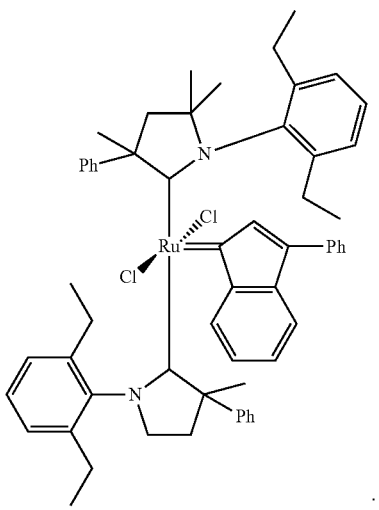

6. The composition according to claim 1, which contains at least two monomers of formula (I) distinct from one another, wherein one monomer is completely soluble in the other monomer, and when said composition is heated to a temperature of from 50° C. to 100° C. for a sufficient length of time it forms a substantially transparent film having at least 90 percent of visible light transmission.

7. The composition according to claim 1, which is comprised of:
5-norbornenylmethyl-eugenol, 5-phenethylbicyclo[2.2.1]hept-2-ene, 1,3-bis(2,4,6-trimethylphenylimifazolidin-2-vlidene)(tricyclohexylphosphine)-(2-oxobenzyludebe)ruthenium(VI) iodide and zirconium oxide nanoparticles.

8. A kit for forming a substantially transparent film comprising:
a) one or more monomers of formula (I):

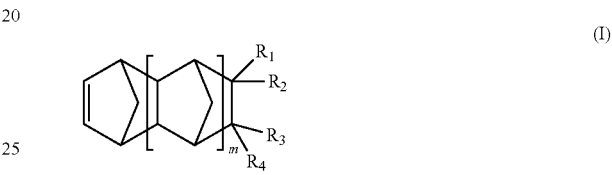

wherein:
m is an integer 0, 1 or 2;
R$_1$, R$_2$, R$_3$ and R$_4$ are the same or different and each independently selected from the group consisting of hydrogen, halogen, methyl, ethyl, linear or branched (C$_3$-C$_{16}$)alkyl, perfluoro(C$_1$-C$_{12}$)alkyl, hydroxy(C$_1$-C$_{16}$)alkyl, (C$_3$-C$_{12}$)cycloalkyl, (C$_6$-C$_{12}$)bicycloalkyl, (C$_7$-C$_{14}$)tricycloalkyl, (C$_6$-C$_{10}$)aryl, (C$_6$-C$_{10}$)aryl(C$_1$-C$_6$)alkyl, perfluoro(C$_6$-C$_{10}$)aryl, perfluoro(C$_6$-C$_{10}$)aryl(C$_1$-C$_3$)alkyl, tri(C$_1$-C$_6$)alkoxysilyl and a group of formula (A):

—Z-Aryl                (A)

wherein:
Z is a bond or a group selected from the group consisting of:
(CR$_5$R$_6$)$_a$, O(CR$_5$R$_6$)$_a$, (CR$_5$R$_6$)$_a$O, (CR$_5$R$_6$)$_a$—O—(CR$_5$R$_6$)$_b$, (CR$_5$R$_6$)$_a$—O—(SiR$_5$R$_6$)$_b$, (CR$_5$R$_6$)$_a$—(CO)O—(CR$_5$R$_6$)$_b$, (CR$_5$R$_6$)$_a$—O(CO)—(CR$_5$R$_6$)$_b$, (CR$_5$R$_6$)$_a$—(CO)—(CR$_5$R$_6$)$_b$, where a and b are integers which may be the same or different and each independently is 1 to 12;
R$_5$ and R$_6$ are the same or different and each independently selected from the group consisting of hydrogen, methyl, ethyl, linear or branched (C$_3$-C$_6$)alkyl, hydroxy, methoxy, ethoxy, linear or branched (C$_3$-C$_6$)alkyloxy, acetoxy, (C$_2$-C$_6$)acyl, hydroxymethyl, hydroxyethyl, linear or branched hydroxy(C$_3$-C$_6$)alkyl, phenyl and phenoxy;
Aryl is phenyl or phenyl substituted with one or more of groups selected from the group consisting of methyl, ethyl, linear or branched (C$_3$-C$_6$)alkyl, hydroxy, methoxy, ethoxy, linear or branched (C$_3$-C$_6$)alkyloxy, acetoxy, (C$_2$-C$_6$)acyl, hydroxymethyl, hydroxyethyl, linear or branched hydroxy(C$_3$-C$_6$)alkyl, phenyl and phenoxy;
b) a latent organo-ruthenium compound selected from the group consisting of:

a compound formula (IIIA):

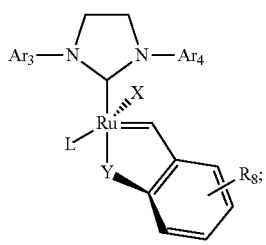

a compound of formula (IIIC):

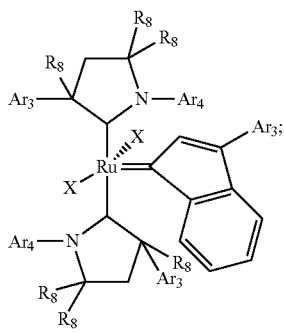

wherein:
X is selected from the group consisting of halogen, —$OR_a$, —$O(CO)R_a$ —$OSO_2R_a$, where $R_a$ is ($C_1$-$C_{12}$) alkyl, ($C_3$-$C_{12}$)cycloalkyl or ($C_6$-$C_{14}$)aryl;
Y is O;
L is $PR_3$, where R is independently selected from the group consisting of isopropyl, sec-butyl, tert-butyl, cyclohexyl, bievelo($C_5$-$C_{10}$)alkyl, phenyl, benzyl, isopropoxy, sec-butoxy, tert-butoxy, cyclohexyloxy, phenoxy and benzyloxy;
$R_s$ is selected from the group consisting of halogen, hydrogen, methyl, ethyl, linear or branched ($C_1$-$C_6$) alkyl, ($C_6$-$C_{10}$)aryl, methoxy, ethoxy, linear or branched ($C_1$-$C_6$)alkoxy, ($C_6$$C_{10}$)aryloxy, —NHCO($C_1$-$C_6$)alkyl, —NHCO—perfluoro($C_1$-$C_6$)alkyl, —$SO_2$N(($C_1$-$C_6$)alkyl)$_2$ and —$NO_2$;
$AR_3$ and $Ar_4$ are the same or different and each independently selected from the group consiting of substituted or unsubstituted biphenyl and substituted or unsubstituted naphthyl;
wherein said substitutents are selected from the group consisting of methy, ethyl, iso-propyl, tert-butyl and phenyl;
c) optionally one or more additives selected from the group consisting of a photoacid generator, a photobase generator, a thermal acid generator, a thermal base generator and a mixture in any combination thereof; and
d) a dispersion comprising nanoparticles.

9. The kit according to claim 8, wherein said nanoparticles comprised of at least one of hafnium oxide, zirconium oxide, hafnium-zirconium oxide and titanium-zirconium oxide.

10. The kit according to claim 8, which contains at least two monomers of formula (I) distinct from one another, wherein one monomer is completely soluble in the other monomer, and when said composition is heated to a temperature of from 50° C. to 100° C. for a sufficient length of time it forms a substantially transparent film having at least 90 percent of visible light transmission.

11. The kit according to claim 8, wherein the latent organo-ruthenium compound is selected from the group consisting of the compound of formula (IIIA) and the compound of formula (IIIC):

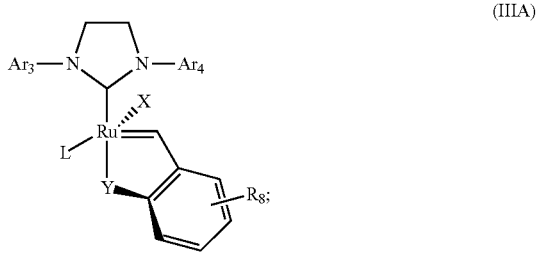

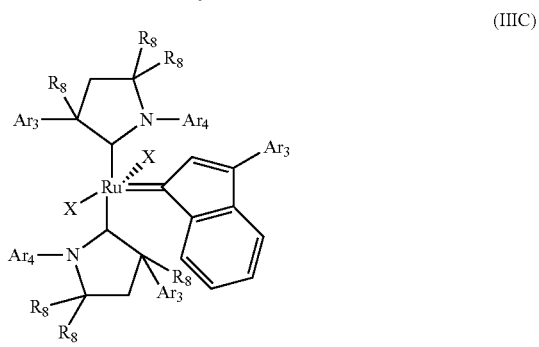

and wherein:
X is selected from the group consisting of chlorine and iodine;
L is $PR_3$, where R is independently selected from the group consisting of isopropyl, sec-butyl, tert-butyl, cyclohexyl, bicyclo($C_5$-$C_{10}$)alkyl, phenyl, benzyl, isopropoxy, sec-butoxy, tert-butoxy, and cyclohexyloxy.

12. The kit according to claim 8, wherein the latent organo-ruthenium compound is selected from the group consisting of:

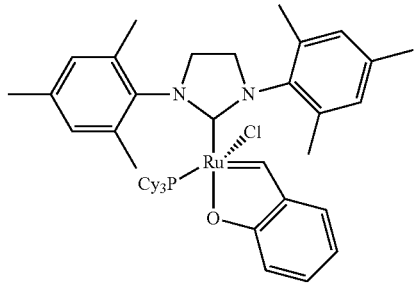

1,3-bis(2,4,6-trimethylphenylimidazolidin-2-ylidene)(tricyclohexylphosphine)-(2-oxobenzylidene)ruthenium(VI) chloride;

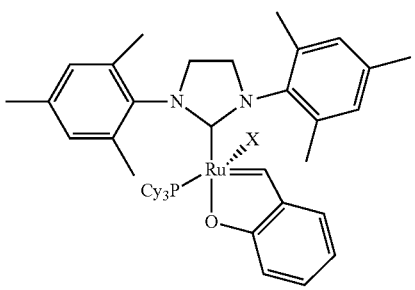

where X=halogen, —OR$_a$, —O(CO)R$_a$—OSO$_2$R$_a$, where R$_a$ is (C$_1$-C$_{12}$)alkyl, (C$_3$-C$_{12}$)cycloalkyl, (C$_6$-C$_{14}$)aryl;

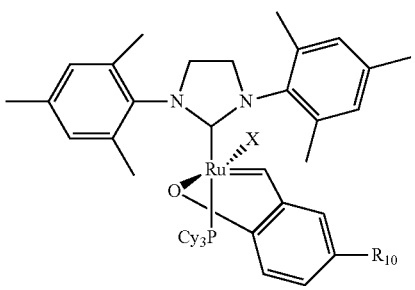

where X is Cl or I and R$_{10}$ is hydrogen, NO$_2$ or Cl; and

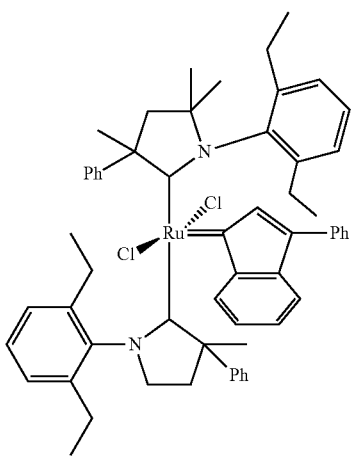

13. The kit according to claim 8, which contains 5-phenethylbicyclo[2.2.1]hept-2-ene (PENB), 5-norbornenylmethyl-eugenol (EuOHNB) and zirconium oxide nanoparticles.

14. A kit for forming a substantially transparent film comprising:
a) one or more monomers of formula (I):

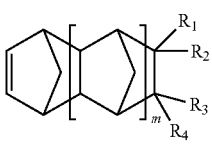

wherein:
m is an integer 0, 1 or 2;
R$_1$, R$_2$, R$_3$ and R$_4$ are the same or different and each independently selected from the group consisting of hydrogen, halogen, methyl, ethyl, linear or branched (C$_3$-C$_{16}$)alkyl, perfluoro(C$_1$-C$_{12}$)alkyl, hydroxy(C$_1$-C$_{16}$)alkyl, (C$_3$-C$_{12}$)cycloalkyl, (C$_6$-C$_{12}$)bicycloalkyl, (C$_7$-C$_{14}$)tricycloalkyl, (C$_6$-C$_{10}$)aryl, (C$_6$-C$_{10}$)aryl(C$_1$-C$_6$)alkyl, perfluoro(C$_6$-C$_{10}$)aryl, perfluoro(C$_6$-C$_{10}$)aryl(C$_1$-C$_3$)alkyl, tri(C$_1$-C$_6$)alkoxysilyl and a group of formula (A):

—Z-Aryl        (A)

wherein:
Z is a bond or a group selected from the group consisting of:
(CR$_5$R$_6$)$_a$, O(CR$_5$R$_6$)$_a$, (CR$_5$R$_6$)$_a$O, (CR$_5$R$_6$)$_a$—O—(CR$_5$R$_6$)$_b$, (CR$_5$R$_6$)$_a$—O—(SiR$_5$R$_6$)$_b$, (CR$_5$R$_6$)$_a$—(CO)O—(CR$_5$R$_6$)$_b$, (CR$_5$R$_6$)$_a$—O(CO)—(CR$_5$R$_6$)$_b$, (CR$_5$R$_6$)$_a$—(CO)—(CR$_5$R$_6$)$_b$, where a and b are integers which may be the same or different and each independently is 1 to 12;
R$_5$ and R$_6$ are the same or different and each independently selected from the group consisting of hydrogen, methyl, ethyl, linear or branched (C$_3$-C$_6$)alkyl, hydroxy, methoxy, ethoxy, linear or branched (C$_3$-C$_6$)alkyloxy, acetoxy, (C$_2$-C$_6$)acyl, hydroxymethyl, hydroxyethyl, linear or branched hydroxy(C$_3$-C$_6$)alkyl, phenyl and phenoxy;
Aryl is phenyl or phenyl substituted with one or more of groups selected from the group consisting of methyl, ethyl, linear or branched (C$_3$-C$_6$)alkyl, hydroxy, methoxy, ethoxy, linear or branched (C$_3$-C$_6$)alkyloxy, acetoxy, (C$_2$-C$_6$)acyl, hydroxymethyl, hydroxyethyl, linear or branched hydroxy(C$_3$-C$_6$)alkyl, phenyl and phenoxy;

b) a latent organo-ruthenium compound selected from the group consisting of:
a compound of formula (IIIA):

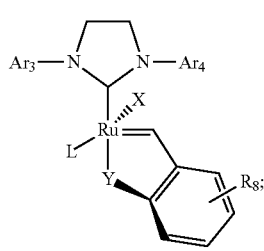

a compound of of formula (IIIC):

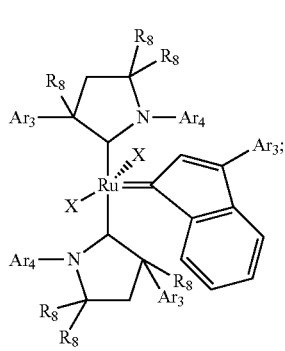

wherein:
X is selected from the group consisting of halogen, —OR$_a$, —O(CO)R$_a$ —OSO$_2$R$_a$, where R$_a$ is (C$_1$-C$_{12}$) alkyl, (C$_3$-C$_{12}$)cycloalkyl or (C$_6$-C$_{14}$)aryl;
Y is O;
L is PR$_3$, where R is independently selected from the group consisting of isopropyl, sec-butyl, tert-butyl, cyclohexyl, bievelo(C$_5$-C$_{10}$)alkyl, phenyl, benzyl, isopropoxy, sec-butoxy, tert-butoxy, cyclohexyloxy, phenoxy and benzyloxy;
R$_s$ is selected from the group consisting of halogen, hydrogen, methyl, ethyl, linear or branched (C$_1$-C$_6$)

alkyl, $(C_6-C_{10})$aryl, methoxy, ethoxy, linear or branched $(C_1-C_6)$alkoxy, $(C_6C_{10})$aryloxy, —NHCO $(C_1-C_6)$alkyl, —NHCO—perfluoro$(C_1-C_6)$alkyl, —SO$_2$N$((C_3-C_6)$alkyl$)_2$ and —NO$_2$;

AR$_3$ and Ar$_4$ are the same or different and each independently selected from the group consiting of substituted or unsubstituted biphenyl and substituted or unsubstituted naphthyl;

wherein said substitutents are selected from the group consisting of methy, ethyl iso-propyl, tert-butyl and phenyl; and c) optionally one or more additives selected from the group consisting of a photoacid generator, a photobase generator, a thermal acid generator, a thermal base generator and a mixture in any combination thereof.

15. The kit according to claim 14, which contains at least two monomers of formula (I) distinct from one another, wherein one monomer is completely soluble in the other monomer, and when said composition is heated to a temperature of from 50° C. to 100° C. for a sufficient length of time it forms a substantially transparent film having at least 90 percent of visible light transmission.

16. The kit according to claim 14, wherein the latent organo-ruthenium compound is selected from the group consisting of:

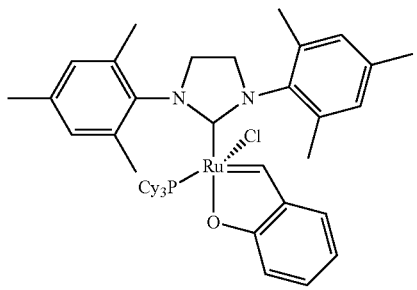

1,3-bis(2,4,6-trimethylphenylimidazolidin-2-ylidene)(tricyclohexylphosphine)-(2-oxobenzylidene)ruthenium(VI) chloride;

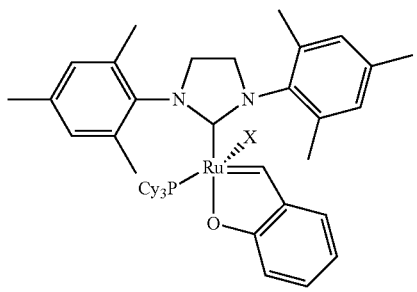

where X=halogen, —OR$_a$, —O(CO)R$_a$, —OSO$_2$R$_a$, where R$_a$ s $(C_1-C_{12})$alkyl, $(C_3-C_{12})$cycloalkyl, $(C_6-C_{14})$aryl;

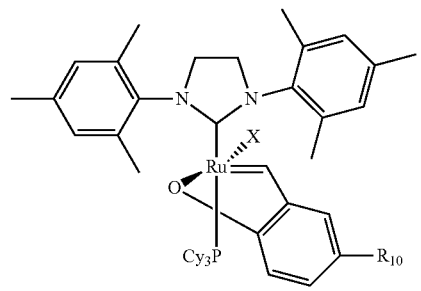

where X is Cl or I and R$_{10}$ is hydrogen, NO$_2$ or Cl; and

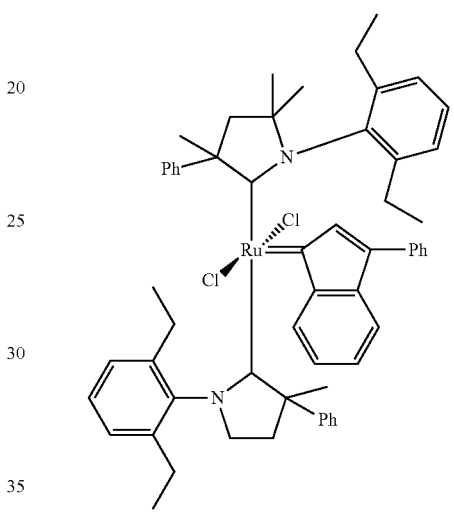

17. The kit according to claim 14, which contains 5-phenethylbicyclo[2.2.1]hept-2-ene (PENB), 5-norbornenylmethyl-eugenol, 1,3-bis(2,4,6-trimethylphenylimidazolidin-2-ylidene)(tricyclohexylphosphine)-(2-oxobenzylidene) ruthenium(VI) iodide and a mixture of (4-thiophenyl) phenyl-diphenylsulfonium hexafluorophosphate and bis-(triphenylsulfonium) sulfide bis-hexafluorophosphate.

18. A film comprising the composition of claim 1.

19. A film formed from the kit of claim 8.

20. A film formed from the kit of claim 14.

* * * * *